US010186674B2

United States Patent
Takechi et al.

(10) Patent No.: US 10,186,674 B2
(45) Date of Patent: Jan. 22, 2019

(54) THIN-FILM DEVICE HAVING BARRIER FILM AND MANUFACTURING METHOD THEREOF

(71) Applicant: NLT Technologies, Ltd., Kanagawa (JP)

(72) Inventors: Kazushige Takechi, Kanagawa (JP); Mamoru Okamoto, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 13 days.

(21) Appl. No.: 15/332,022

(22) Filed: Oct. 24, 2016

(65) Prior Publication Data

US 2017/0117498 A1    Apr. 27, 2017

(30) Foreign Application Priority Data

Oct. 22, 2015    (JP) ................. 2015-208279

(51) Int. Cl.
*H01L 51/00*    (2006.01)
*H01L 29/08*    (2006.01)
(Continued)

(52) U.S. Cl.
CPC ...... *H01L 51/5036* (2013.01); *H01L 27/1218* (2013.01); *H01L 27/1266* (2013.01); *H01L 29/7869* (2013.01); *H01L 29/78603* (2013.01); *H01L 51/0097* (2013.01); *H01L 51/4293* (2013.01); *H01L 27/1222* (2013.01); *Y02E 10/549* (2013.01)

(58) Field of Classification Search
CPC ......... H01L 2251/5338; H01L 51/5036; H01L 29/7869; H01L 51/0097; H01L 51/4293; H01L 27/1266; H01L 21/76254; H01L 21/76259; H01L 21/2007; H01L 21/76251; Y02E 10/549
USPC .................... 257/40, E21.122; 438/458, 455
See application file for complete search history.

(56) References Cited

U.S. PATENT DOCUMENTS

| | | | |
|---|---|---|---|
| 6,028,020 A | 2/2000 | Tanaka et al. | |
| 2004/0052975 A1* | 3/2004 | Komada | B32B 27/00 427/574 |

(Continued)

FOREIGN PATENT DOCUMENTS

| | | |
|---|---|---|
| JP | 08-213871 | 8/1996 |
| JP | 2005-178363 | 7/2005 |

(Continued)

OTHER PUBLICATIONS

Yamaguchi et al., "Flexible AMOLED Displays Driven by a-IGZO TFTs and Their Applications", IDW/AD'12 Proceedings of the 19th International Display Workshops, p. 851-854.

(Continued)

*Primary Examiner* — Lex Malsawma
*Assistant Examiner* — Nduka Ojeh
(74) *Attorney, Agent, or Firm* — Young & Thompson

(57) ABSTRACT

A thin-film device includes a resin film which includes a first surface and a second surface facing the first surface, a first inorganic layer on the first surface, a thin-film element on the first inorganic layer, and a second inorganic layer on the second surface, wherein a film density of the second inorganic layer is greater than a film density of the first inorganic layer.

20 Claims, 24 Drawing Sheets

(51) Int. Cl.
  *H01L 35/24* (2006.01)
  *H01L 51/50* (2006.01)
  *H01L 29/786* (2006.01)
  *H01L 51/42* (2006.01)
  *H01L 27/12* (2006.01)

(56) References Cited

U.S. PATENT DOCUMENTS

| | | | |
|---|---|---|---|
| 2005/0090075 A1 | 4/2005 | Takayama et al. | |
| 2008/0292786 A1 | 11/2008 | Hatano et al. | |
| 2009/0004772 A1* | 1/2009 | Jinbo | H01L 27/1214 438/99 |
| 2011/0290322 A1* | 12/2011 | Meguro | H01L 31/022466 136/256 |
| 2012/0032323 A1* | 2/2012 | Matsumoto | H01L 21/76801 257/737 |
| 2015/0123098 A1* | 5/2015 | Kang | H01L 51/5253 257/40 |
| 2015/0200370 A1* | 7/2015 | Unnikrishnan | H01L 51/4293 257/40 |
| 2016/0093591 A1* | 3/2016 | Lan | H01L 21/02164 257/506 |

FOREIGN PATENT DOCUMENTS

| | | |
|---|---|---|
| JP | 2006-216891 | 8/2006 |
| JP | 2008-292608 | 12/2008 |
| JP | 2014-211638 | 11/2014 |

OTHER PUBLICATIONS

Teramoto et al., A 9.9-in. qHD Top-Emission Flexible OLED Display Driven by Oxide TFTs, IDW/AD'12 Proceedings of the 19th International Display Workshops, p. 855-858.

* cited by examiner

THIN-FILM ELEMENT FORMED BY OXIDE SEMICONDUCTOR THIN-FILM TRANSISTOR

CUT ALONG INSIDE POSITIONS OF GERMANIUM OXIDE FILM PATTERN (BROKEN LINES)

SEPARATE

THIN-FILM DEVICE HAVING BARRIER FILM AND MANUFACTURING METHOD THEREOF

CROSS-REFERENCE TO RELATED APPLICATIONS

This Nonprovisional application claims priority under 35 U.S.C. § 119(a) on Patent Application No. 2015-208279 filed in Japan on Oct. 22, 2015, the entire contents of which are hereby incorporated by reference.

FIELD

The present application relates to a thin-film element such as a thin-film transistor, a thin-film diode, or a thin-film cell which is formed on a resin substrate and a display device including thin-film elements and pixel display portions, and more particularly, to a structure of a flexible thin-film device or a flexible display device and a manufacturing method thereof.

BACKGROUND

Thin-film elements formed on a flexible substrate such as a resin substrate, such as thin-film transistors or PIN-junction thin-film diodes, have widely been researched and developed to realize a flexible electronic device such as a flexible display, a flexible solar battery utilizing characteristics that it is light, has no crack, is flexible, and the like. Particularly, regarding the flexible display, an organic electroluminescence (EL) display which is more advantageous in flexibility has actively been researched and developed in comparison with a liquid crystal display requiring precise cell gap control.

In general, a flexible substrate such as a resin substrate has lower heat resistance than that of a glass substrate or the like. Accordingly, when a base film or thin-film elements are formed on the resin substrate or a barrier film is formed on the surface of the resin substrate opposite to the thin-film elements, a low-temperature process of about 200° C. or lower is necessary. Accordingly, the research and development has progressed with a focus on how to form a high-quality thin film or thin-film element at a low temperature.

As a thin-film element having a characteristic of relatively high quality in the low-temperature process, a thin-film transistor using oxide semiconductor for an active layer has attracted attention in recent years. Particularly, a flexible organic EL display using the oxide semiconductor thin-film transistor as a switching element of a pixel has actively been researched and developed.

Regarding flexible organic EL displays using an oxide semiconductor thin-film transistor on a resin substrate, papers such as IDW/AD'12 Proceedings of the 19th International Display Workshops, p. 851 and IDW/AD'12 Proceedings of the 19th International Display Workshops, p. 855 have been reported. In both papers, a polyimide layer as a resin substrate is formed on a glass substrate by application, oxide semiconductor thin-film transistors, an organic EL layer including a light-emitting layer, a carrier injecting and transporting layer, and electrodes, and a sealing layer are formed on a substrate with a monolithic structure of the polyimide layer and the glass substrate, and finally mechanically separating the glass substrate from the polyimide layer, thereby a flexible organic EL display is manufactured.

Formation of thin-film elements such as thin-film transistors directly on a resin substrate as a single body has a high wall against commercialization in view of difficulty in a low-temperature process, difficulty in precise positioning of thin-film patterns on the resin substrate, and the like. In order to solve this problem, a technique of separating high-performance and high-precision thin-film elements which have temporarily been formed on a glass substrate by high-temperature processes from the glass substrate using a certain method and the thin-film elements onto a resin substrate is disclosed.

For example, a quartz vibrator using single-crystal thin-film quartz which is obtained by forming an oxide single-crystal film containing $GeO_2$ as a major component on a single-crystal substrate, forming the single-crystal thin-film quartz thereon, and dissolving $GeO_2$ in an aqueous solution to separate them is disclosed (Japanese Patent Laid-Open No. 8-213871).

As a similar technique, a technique of forming a stacked structure of protective layer/thin-film element/$GeO_x$/glass, separating the glass by immersing the stacked structure in water or the like and dissolving the $GeO_x$, and forming a flexible thin-film device by transferring by bonding a support base (film or the like) to a separation surface and separating the protective layer is disclosed (Japanese Patent Laid-Open No. 2006-216891).

As a technique similar to the above-mentioned technique disclosed in the non-patent literature, a technique of forming a resin film on a glass substrate, forming thin-film elements thereon, and separating the glass substrate by irradiating the rear surface of the glass substrate with ultraviolet light is disclosed (Japanese Patent Laid-Open No. 2008-292608).

A technique of forming a protective film (a protective film having high blocking performance of gas which may give a certain damage to elements when a film is formed directly on the elements) having high gas barrier capability in advance on a heat-resistant substrate other than a substrate having elements formed thereon, transferring the protective film onto the substrate having elements formed thereon, and sealing the resultant structure is disclosed (Japanese Patent Laid-Open No. 2005-178363). Alternatively, a technique of coating one surface or both surfaces of a resin substrate with a diamond-like carbon (DLC) film as a protective film, bonding the resultant structure to a glass substrate with an adhesive layer interposed therebetween, forming elements thereon, and separating the glass substrate from the adhesive layer by irradiation with a laser beam is disclosed (Japanese Patent Laid-Open No. 2014-211638).

As described above, various techniques are disclosed as methods of manufacturing a flexible thin-film device or a flexible display device.

In such techniques, active elements such as thin-film transistors are first formed on a glass substrate on which a resin film (resin substrate) is formed by using application or coating, display elements such as organic EL elements, liquid crystal elements, or electrophoretic elements are formed thereon, and then the glass substrate is separated. In consideration of heat resistance of the resin substrate, it is necessary to form a passivation film of an inorganic insulating film or the like at about 300° C. at the time of formation of the active elements such as thin-film transistors. By forming a film at about 300° C., it is possible to form an insulating film having certain high barrier capability. In this way, a film having relatively high barrier capability can be formed on the active elements.

On the other hand, thin-film transistors are formed on the resin substrate through a process temperature of about 300° C. Accordingly, there is a problem in that adhesiveness between the glass substrate and the resin substrate increases due to the temperature and a yield decreases at the time of finally mechanically separating the glass substrate as described in the related art. No barrier film is formed on the rear surface of the resin substrate after the glass substrate is separated. In the techniques disclosed in the literatures, a barrier film can be formed on the rear surface of the resin substrate after the glass substrate is separated, but a low-temperature film formation technique at 100° C. or lower is necessary in consideration of heat-resistant temperatures of organic materials which are used in organic EL elements, liquid crystal elements, electrophoretic elements, or the like. The barrier capability of a film obtained by such a low-temperature film formation technique is very low.

When the barrier capability of the rear side of the resin substrate is low in this way, the following problems become marked. As disclosed in FIG. 4 of Non-patent Literature 1, a flexible device is manufactured by separating the glass substrate from the resin substrate after active elements (thin-film transistors in this case) or display elements (organic EL elements in this case) are formed. In this step, a barrier film is not formed on the rear surface of the resin film and thus the resin substrate starts moisture absorption immediately after the separation and thus swells more or less. This swelling causes formation of an unintended warp or fold in the flexible device, which is a severe problem in production. Accordingly, it is very important to secure high barrier capability on the rear surface side of the resin substrate. In order to effectively suppress the moisture absorption on the rear surface side of the resin substrate, high-temperature film formation techniques of 350° C., preferably, 400° C. or higher are required. On the contrary, when a barrier film is formed after the glass substrate is separated, organic EL elements are formed in advance, thus low-temperature film formation techniques of 100° C. or lower are required, and thus a film having low barrier capability is obtained. Alternatively, it is very difficult to form a barrier film on a substrate having organic EL elements formed thereon. As well as the organic EL elements, the same problem is caused when liquid crystal elements or electrophoretic elements as display devices are formed on thin-film transistors.

As described above, the following problems are apparent in the related art.

When the glass substrate is mechanically or physically separated from the resin substrate after a thin-film device including active elements and display elements is formed, a separation yield decreases due to an influence of an adhesive force between the resin substrate and the glass substrate. For example, when a region partially having a stronger adhesive force is present at random, the region is not separated well, which causes a decrease in yield.

It is very difficult to perform a process of forming a barrier film on the rear surface of the resin substrate after separation. For example, when a barrier film is formed on the rear surface of the resin substrate of a thin-film device in which thin-film transistors and display elements are stacked on the resin substrate, it is difficult to carry the thin-film device in process equipment and it is necessary to perform considerable low-temperature film formation of about 100° C. or lower. The barrier capability of a thin film formed by this low-temperature film formation is low.

All the techniques in the related art have common problems in that separation yield is low and barrier capability of a barrier film is low in a structure having the barrier film against infiltration of gas or moisture on the rear surface of the resin substrate.

SUMMARY

According to one aspect, a thin-film device includes a resin film which includes a first surface and a second surface facing the first surface, a first inorganic layer on the first surface, a thin-film element on the first inorganic layer, and a second inorganic layer on the second surface, wherein a film density of the second inorganic layer is greater than a film density of the first inorganic layer.

The above and further objects and features of the invention will more fully be apparent from the following detailed description with accompanying drawings.

DESCRIPTION OF EMBODIMENTS

Embodiments of the invention will be described below with reference to the accompanying drawings.

First Embodiment

Figure 1:
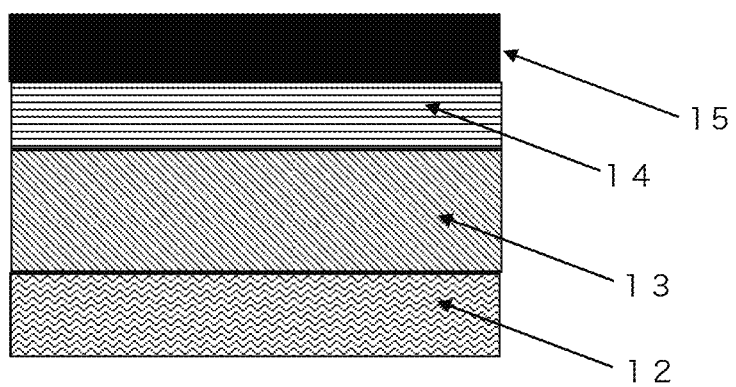
FIG. 1 is a cross-sectional view illustrating a structure of a thin-film device according to a first embodiment of the invention.

FIG. 1 is a cross-sectional view illustrating a structure of a thin-film device according to a first embodiment of the disclosure. The first embodiment of the disclosure will be described below with reference to FIG. 1. A barrier film (first inorganic layer) 14 is formed on one surface of a resin layer 13 and a thin-film element 15 is formed on the barrier film 14. A dense inorganic barrier film (second inorganic layer) 12 is formed on the other surface of the resin layer 13. A film density of the dense inorganic barrier film 12 is higher than the film density of the barrier film 14. This is because the dense inorganic barrier film 12 is formed at a temperature higher than that of the barrier film 14. More specifically, the dense inorganic barrier film 12 is formed at a temperature higher than a heat-resistant temperature of the resin layer 13, and the barrier film 14 is formed at a temperature lower than the heat-resistant temperature of the resin layer 13.

As described above, the thin-film device includes the resin layer 13 (resin film) which includes a first surface and a second surface facing the first surface, the barrier film 14 (first inorganic layer) on the first surface, the thin-film element 15 on the barrier film 14, and the dense inorganic barrier film 12 (second inorganic layer) on the second surface, wherein a film density of the dense inorganic barrier film 12 is greater than a film density of the barrier film 14.

Figure 2A:
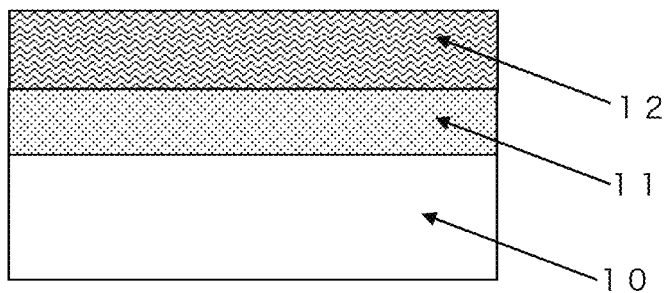
FIG. 2A is a cross-sectional view illustrating a method of manufacturing the thin-film device according to the first embodiment of the invention.
Figure 2B:
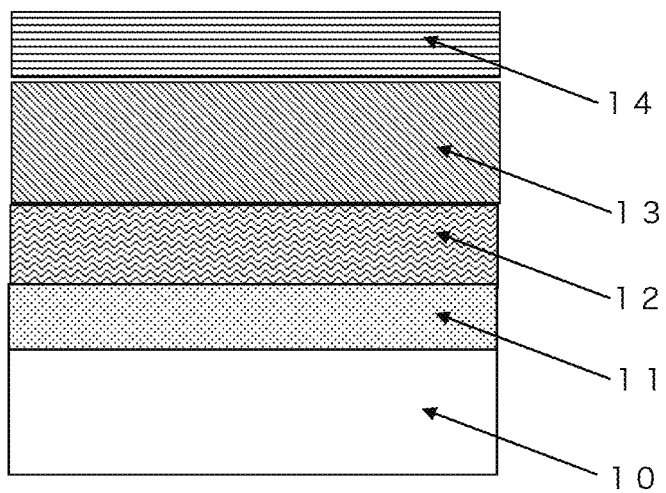
FIG. 2B is a cross-sectional view illustrating the method of manufacturing the thin-film device according to the first embodiment of the invention.
Figure 2C:
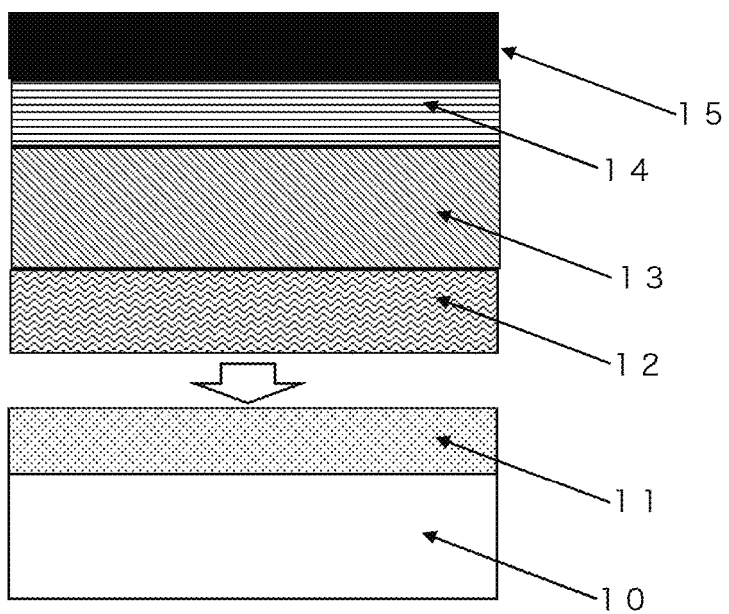
FIG. 2C is a cross-sectional view illustrating the method of manufacturing the thin-film device according to the first embodiment of the invention.
Figure 2D:
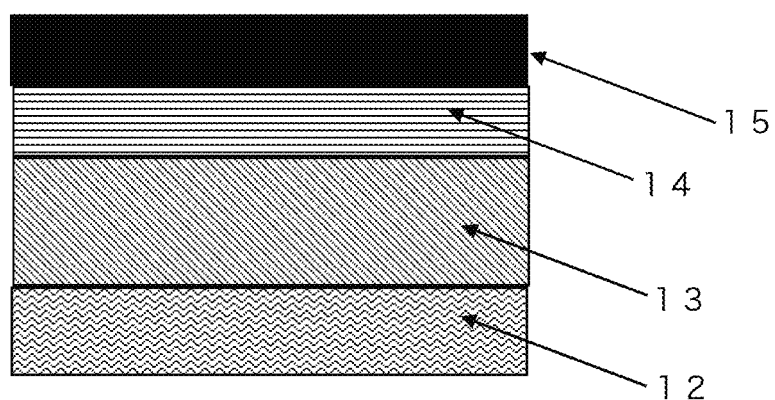
FIG. 2D is a cross-sectional view illustrating the method of manufacturing the thin-film device according to the first embodiment of the invention.

FIGS. 2A to 2D are diagrams illustrating a method of manufacturing the thin-film device according to the first embodiment of the disclosure. A separation layer 11 is formed on a heat-resistant substrate 10, and an inorganic barrier film is formed thereon. Since the heat-resistant substrate 10 has high heat resistance, the inorganic barrier film is formed, for example, using a process of about 350° C. to 450° C. or the inorganic barrier film is densified into a dense inorganic barrier film (second inorganic layer) 12 having high barrier capability by a technique of performing an annealing process of about 350° C. to 450° C. after the inorganic barrier film is formed (FIG. 2A). Alternatively, the dense inorganic barrier film can be formed by a high-temperature process of 450° C. or higher using a heat-resistant substrate of glass, quartz, or the like. In this case, a dense inorganic barrier film very close to a thermal oxide film can be formed. The resin layer (resin film) 13 is formed on the dense inorganic barrier film 12 and the barrier film (first inorganic layer) 14 is formed thereon (FIG. 2B). The barrier film 14 needs to be formed at a temperature lower than the heat-resistant temperature (typically about 300° C.) of the resin layer 13. The thin-film element 15 is formed thereon and the heat-resistant substrate 10 is separated from the separation layer 11 using a certain technique after the formation of the thin-film element 15 is completed (FIG. 2C), thereby a flexible thin-film device having the dense inorganic barrier film 12 having high barrier capability on a rear surface side of the resin layer 13 is realized (FIG. 2D). At this time, the dense inorganic barrier film 12 is formed at a temperature (about 350° C. to 450° C.) higher than the heat-resistant temperature of the resin layer 13 and has a film density higher than that of the barrier film 14.

Second Embodiment

Figure 3:
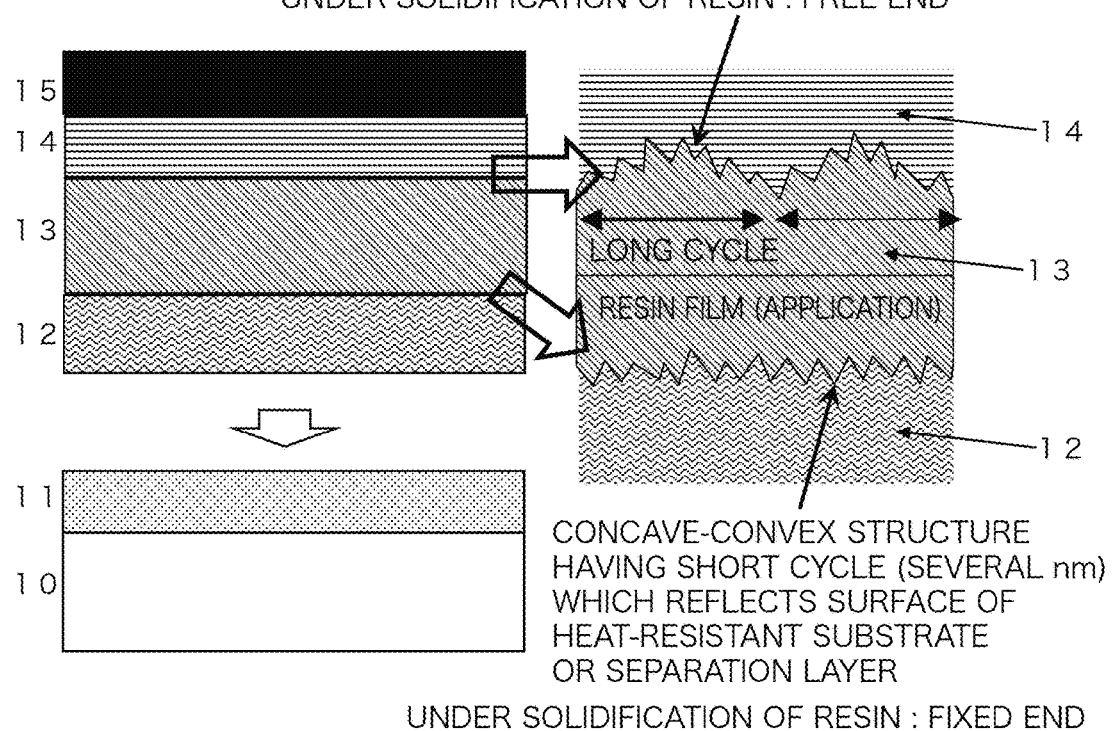
FIG. 3 is a cross-sectional view illustrating a structure of a thin-film device according to a second embodiment of the invention.

FIG. 3 is a diagram illustrating a thin-film device according to a second embodiment of the present disclosure. Here, the resin layer 13 is formed on the dense inorganic barrier film 12 by application or coating. In this case, as illustrated in a cross-sectional enlarged view on the right side, an interface between the resin layer 13 and the dense inorganic barrier film 12 has a concave-convex structure with a short cycle (a cycle of about several nm) which reflects a surface state of the heat-resistant substrate 10 or the separation layer 11. Here the concave-convex structure with the short cycle indicates that a first average spacing of a roughness at the interface is small. On the other hand, an interface between the barrier film 14 and the resin layer 13 has a concave-convex structure with a long cycle (a cycle of about several hundreds nm to several tens μm) due to thickness irregularity of the resin layer 13 at the time of application or coating. Here the concave-convex structure with the long cycle indicates that a second average spacing of the roughness at the interface is larger than the first average spacing. This is because the concave-convex structure of the interface between the resin layer 13 and the dense inorganic barrier film 12 results from the interface serving as a fixed end at the time of solidification of the resin layer, but the concave-convex structure of the interface between the barrier film 14 and the resin layer 13 results from the surface of the resin layer serving as a free end at the time of solidification of the resin layer. Accordingly, in the second embodiment, the structures having different concave-convex cycles are formed on the top surface and the bottom surface of the resin layer.

As described above, the average spacing of the roughness at the interface between the barrier film 14 (first inorganic layer) and the resin layer 13 (resin film) is larger than the average spacing of the roughness at the interface between the dense inorganic barrier film 12 (second inorganic layer) and the resin layer 13.

Third Embodiment

Figure 4:
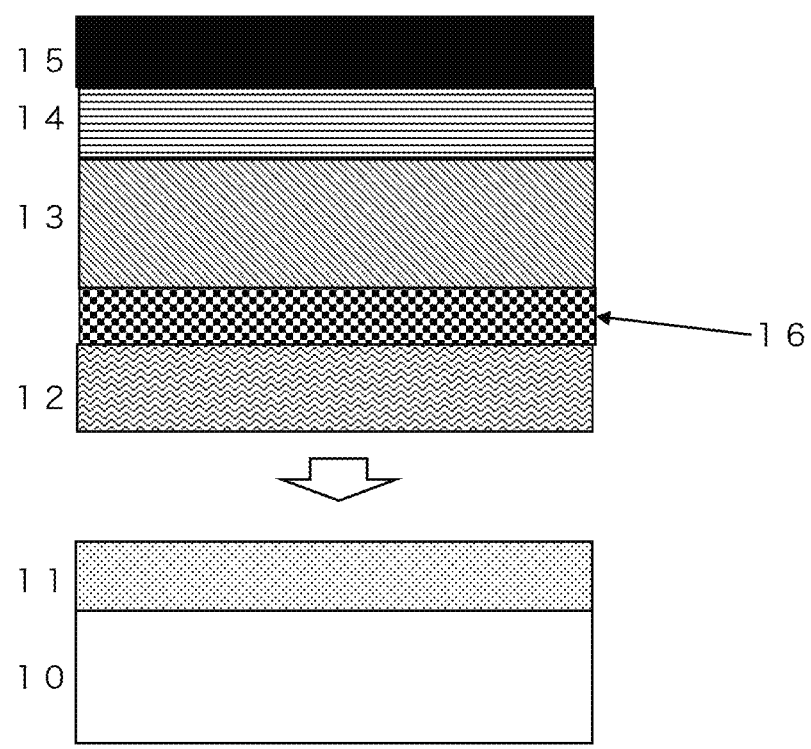
FIG. 4 is a cross-sectional view illustrating a structure of a thin-film device according to a third embodiment of the invention.

FIG. 4 is a diagram illustrating a thin-film device according to a third embodiment of the disclosure. In contrast to the case illustrated in FIG. 3, the resin layer 13 is formed by laminating. That is, the resin layer 13 formed in a film shape in advance is bonded onto the dense inorganic barrier film 12. In this case, an adhesive layer 16 is present between the resin layer 13 and the dense inorganic barrier film 12. Here, the dense inorganic barrier film 12 is formed, for example, at a process temperature of about 350° C. to 450° C., or is densified to have high barrier capability by a technique of forming an annealing process at a temperature of about 350° C. to 450° C. after the film is formed. In the disclosure, a certain base element can be disposed on an opposite surface of a surface of the dense inorganic barrier film 12 in contact with the adhesive layer 16. In this case, an adhesive is present between the opposite surface and the base element.

As described above, the dense inorganic barrier film 12 (second inorganic layer) and the resin layer 13 (resin film) are bonded by the adhesive layer 16.

Fourth Embodiment

Figure 5:
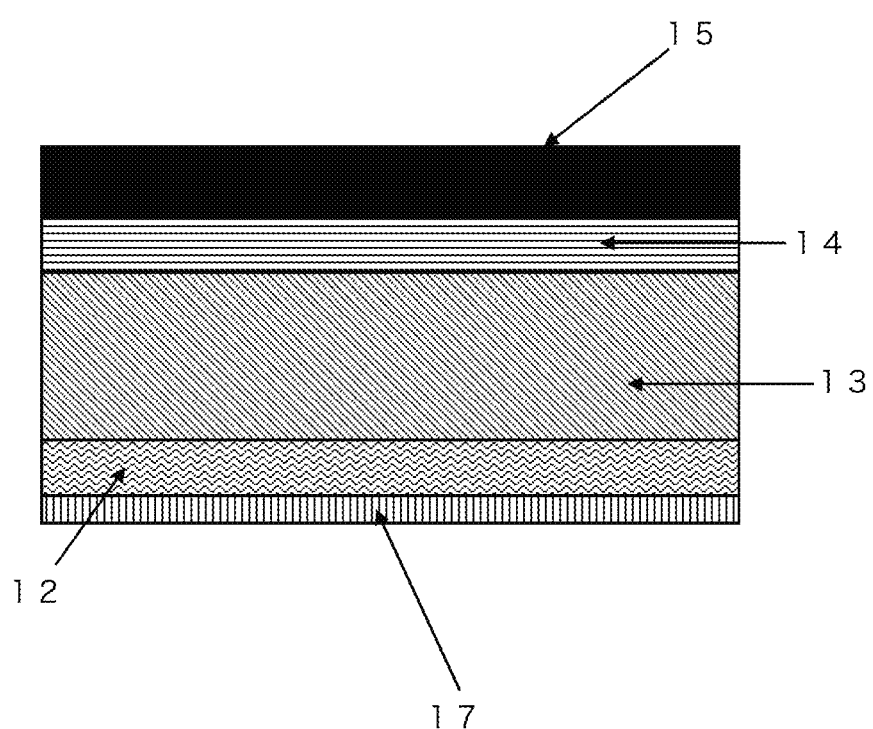
FIG. 5 is a cross-sectional view illustrating a structure of a thin-film device according to a fourth embodiment of the invention.

FIG. 5 is a diagram illustrating a thin-film device according to a fourth embodiment of the disclosure. The barrier film 14 and the thin-film element 15 are formed on one surface of the resin layer 13, and the dense inorganic barrier film 12 is formed on the other surface. A surface layer 17 containing germanium is formed on the surface of the dense inorganic barrier film 12. An arbitrary active element, a passive element, or an electrochemical element such as a thin-film transistor, a thin-film diode, a thin-film resistor, a thin-film capacitor, a thin-film cell, or a composite element having a combination thereof can be used as the thin-film element 15.

First Example

Figure 6A:
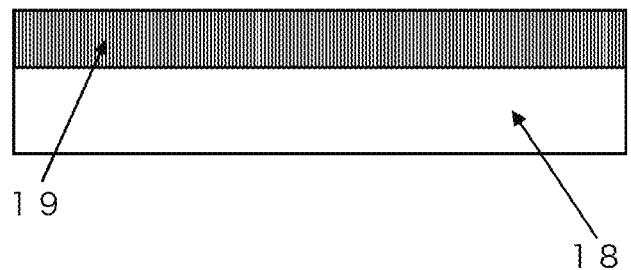
FIG. 6A is a diagram illustrating a manufacturing method according to a first example of the fourth embodiment of the invention.

FIGS. 6A to 6G are diagrams illustrating a manufacturing method according to a first example of the fourth embodiment of the disclosure. The manufacturing method according to an example of the fourth embodiment when the thin-film element 15 is an oxide semiconductor thin-film transistor will be described below with reference to FIGS. 6A to 6G. A germanium oxide film 19 is formed on a glass substrate 18 as the heat-resistant substrate 10 by a sputtering method (FIG. 6A). The germanium oxide film 19 is formed with a thickness of 1 μm by performing reactive sputtering film formation under a gas condition of a flow ratio 1:1 of argon gas and oxygen gas using a germanium target. The substrate temperature is not particularly intentionally raised. High-speed film formation of 200 nm/min is possible using the germanium target. The germanium oxide film 19 can be formed by a sputtering method using a germanium oxide target, but the film formation speed is likely to decrease to 100 nm/min or less.

Figure 6B:
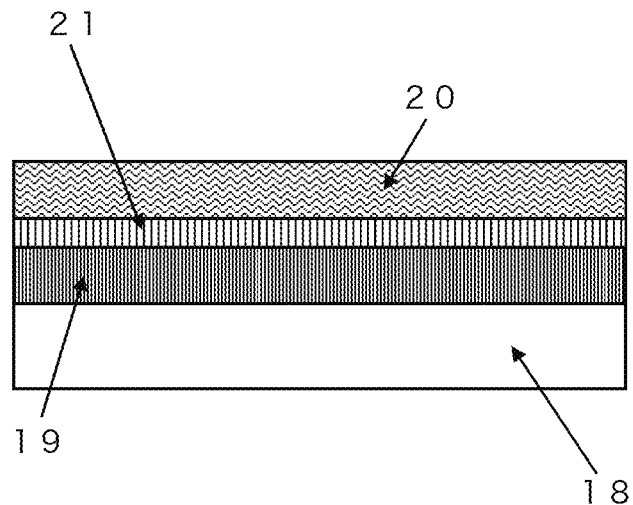
FIG. 6B is a diagram illustrating the manufacturing method according to the first example of the fourth embodiment of the invention.

Thereafter, a dense silicon oxide film 20 as the dense inorganic barrier film 12 is formed with a thickness of 200 nm on the germanium oxide film 19 at a substrate temperature of 350° C. using a plasma chemical vapor deposition (CVD) method. In order to form a silicon oxide film using the plasma CVD method, a method using mixed gas of $SiH_4$ and $N_2O$, a method using mixed gas of tetra ethyl ortho silicate (TEOS) and $O_2$, or the like can be used. When a silicon oxide film is formed at a substrate temperature of 350° C., mutual diffusion of atoms due to heat occurs in the interface between the germanium oxide film 19 and the silicon oxide film and a silicon oxide surface layer 21 containing germanium is formed on the surface of the silicon oxide film (FIG. 6B). When the silicon oxide surface layer 21 is analyzed using X-ray photoelectron spectroscopy (XPS), a peak based on a Si—O bond and a peak based on a Ge—O bond are observed, and it can be seen that the surface layer is a silicon germanium oxide film and germanium is present in a state in which germanium is chemically bonded to oxygen.

The silicon oxide film as the dense inorganic barrier film 12 can be formed by the plasma CVD method, and also can be formed by various film formation methods such as a sputtering method, a deposition method, and an application method. These film formation methods may be performed at a room temperature, but it is important to perform an annealing process at a high temperature of 350° C. or higher, preferably 400° C. or higher, after the film is formed. In general, a silicon oxide film which is formed at a low temperature has a small film density and low barrier capability against moisture or the like, and contains various unnecessary impurities therein. By performing the annealing process at a high temperature, the silicon oxide film can be densified to increase the density thereof and unnecessary impurities in the film can be removed. By mutual diffusion of atoms due to heat as in the plasma CVD film formation, the silicon oxide surface layer 21 containing germanium is formed in the interface between the dense silicon oxide film 20 and the germanium oxide film 19. The high-temperature film formation and the high-temperature annealing for densification are possible because the glass substrate 18 has heat resistance.

Figure 6C:
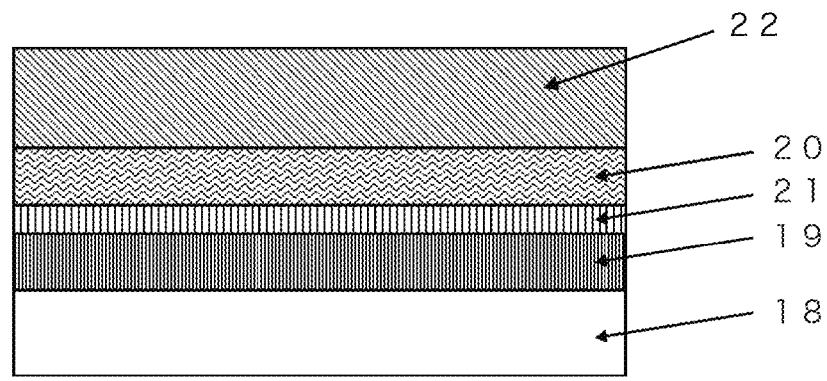
FIG. 6C is a diagram illustrating the manufacturing method according to the first example of the fourth embodiment of the invention.

Subsequently, a polyimide film 22 with a thickness of 30 μm is formed as the resin layer 13 on the dense silicon oxide film 20 (FIG. 6C). As a method of forming the polyimide film 22, a method of forming a polyimide film 22 by applying and baking a source solution, a method of laminating a film-like polyimide film 22 which has been formed in advance on the dense silicon oxide film 20, or the like can be used. Specifically, a desired polyimide film 22 can be formed by applying and printing polyimide varnish onto the dense silicon oxide film 20 and performing an annealing process thereon at about 150° C. to 250° C. In the case of printing, the polyimide film 22 having a desired shape can be formed by printing varnish in only a necessary region on a substrate. In this case, as illustrated in FIG. 3, a structure having a short concave-convex cycle (a cycle of about several nm) which reflects a surface state of the glass substrate 18 or the germanium oxide film 19 is formed in the interface between the polyimide film 22 and the dense silicon oxide film 20. On the other hand, a structure having a long concave-convex cycle (a cycle of about several hundreds nm to several tens µm) due to thickness irregularity of the polyimide film 22 at the time of application or printing is formed in the interface between a barrier film 23 to be described later and the polyimide film 22. In the case of laminating, similarly, a polyimide film may be laminated onto only a necessary region on the substrate. For example, by forming the polyimide film 22 in a region other than an edge of the substrate such that the polyimide film 22 is not present in the edge of the substrate and then forming the barrier film 23 on the entire surface of the substrate as will be described later, the polyimide film 22 in addition to the end face of the substrate can be completely sealed with the barrier film 23. Accordingly, it is possible to prevent impurities due to the polyimide film 22 from being mixed into a thin-film element 15 at the time of formation of the thin-film element 15 to be performed later. In the case of laminating, as illustrated in FIG. 4, a structure in which the adhesive layer 16 is present between the polyimide film (the resin layer 13) and the dense inorganic barrier film 12 (the second inorganic layer) is formed.

The resin layer 13 may be formed of polyimide as described above or may be formed of a resin containing polyimide as a major component. In addition to polyimide, a resin having heat resistance at 100° C. or higher and containing as a major component polyether sulfone (PES), polyethylene terephthalate (PET), polyethylene naphthalate (PEN), or the like can be used. Particularly, the heat-resistant temperature of a resin layer which is transparent to visible light (in which transmittance of light with a wavelength of 400 nm to 700 nm is 80% or more) is likely to decrease, but the dense inorganic barrier film 12 can be formed on a rear surface of such a transparent resin layer using a high-temperature process in the disclosure.

Figure 6D:
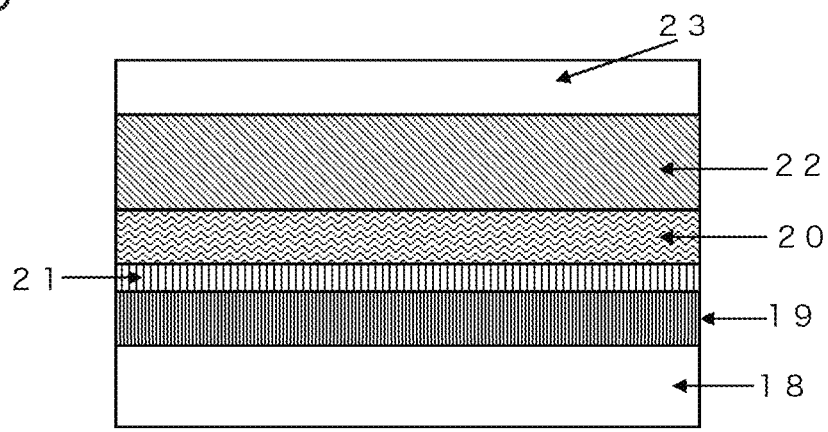
FIG. 6D is a diagram illustrating the manufacturing method according to the first example of the fourth embodiment of the invention.

Subsequently, the barrier film 23 of silicon oxide is formed on the polyimide film 22 (FIG. 6D). The film is formed at a substrate temperature of 300° C. using the plasma CVD method. Unlike the dense silicon oxide film 20, since the barrier film 23 based on silicon oxide is formed on the polyimide film 22 which is an organic material having low heat resistance, the low-temperature film formation or the low-temperature annealing has to be performed.

Figure 6E:
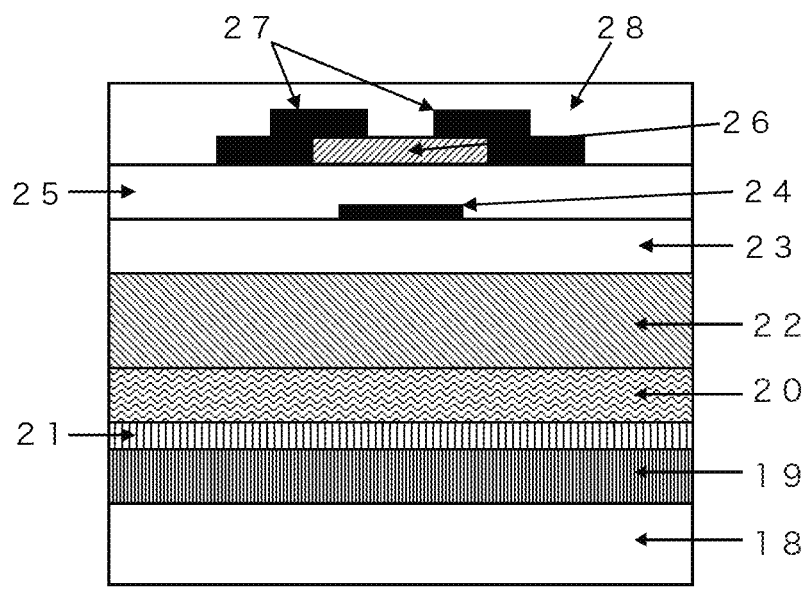
FIG. 6E is a diagram illustrating the manufacturing method according to the first example of the fourth embodiment of the invention.

An oxide semiconductor thin-film transistor as a thin-film element 15 is formed on the barrier film 23. First, a gate electrode 24 is formed of aluminum alloy. Thereafter, a silicon oxide film as a gate insulating film 25 is formed with a thickness of 300 nm at a temperature of 300° C. using the plasma CVD method. Subsequently, a thin film containing an oxide compound of In, Ga, and Zn (hereinafter, abbreviated to InGaZnO) is formed with a thickness of 50 nm using a sputtering method and is patterned in a desired island shape to form an oxide semiconductor film 26. Source and drain electrodes 27 are formed of molybdenum so as to overlap the island-shaped oxide semiconductor film 26. A silicon oxide film as a passivation film 28 is formed with a thickness of 300 nm at 200° C. using a plasma CVD method (FIG. 6E). In this example, the layers 24 to 28 correspond to the thin-film element 15 illustrated in FIG. 1. Here, the oxide semiconductor film 26 is not limited to the oxide of the compound of In, Ga, and Zn, but can be formed of an oxide containing at least In such as InZnO, InGaO, InSiO, or InAlO or an oxide containing at least Zn such as ZnO or ZnSnO.

Figure 6F:
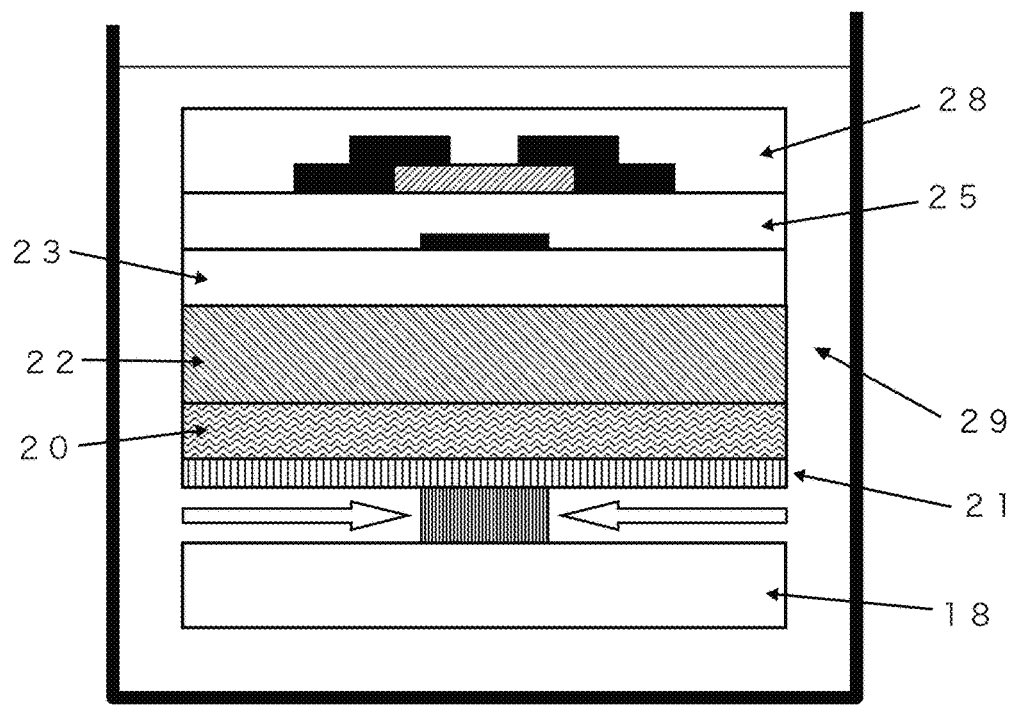
FIG. 6F is a diagram illustrating the manufacturing method according to the first example of the fourth embodiment of the invention.

After the oxide semiconductor thin-film transistor is formed as described above, the entire sample is immersed in hot water 29 of 70° C. (FIG. 6F). At this time, since the etching rate of germanium oxide by hot water is very high, etching progresses at a high speed in the direction of an arrow in the drawing and the glass substrate 18 can be separated. The temperature of hot water can be arbitrarily set depending on the substrate size, hot water of from the room temperature to about 60° C. may be used, for example, in the case of a small substrate with a side of several cm not requiring high-speed etching, or hot water of about 70° C. to 95° C. can be suitably used in the case of a large substrate with a side of several tens cm to 100 cm or more requiring high-speed etching. From the viewpoint of enabling etching and separation at a high speed, a dilute acid of about 0.01% to 5% may be used instead of the hot water. Examples of the dilute acid include a dilute hydrochloric acid, a dilute nitric acid, a dilute sulfuric acid, a dilute acetic acid, a dilute oxalic acid, and an arbitrary mixed acid thereof. The etching progresses at a high speed which is two times to ten times the etching speed when the hot water is used, and thus productivity is improved. When the temperature of the dilute acid is raised from 40° C. to 80° C. and the etching is performed, the etching can progress at a higher speed. Regarding the etching rate of the germanium oxide film 19 by hot water of 70° C., both an as-deposited film formed by room-temperature sputtering deposition (a film before surface treatment is performed immediately after being formed) and a film subjected to an annealing process of 400° C. after being formed exhibit a high rate of about 180 nm/sec. In this way, the germanium oxide film 19 exhibits a high etching rate even after a high-temperature process of about 400° C. is performed thereon, which shows that a high etching rate is maintained even after a dense inorganic barrier film is formed on the germanium oxide film by a high-temperature process and the resultant effectively serves as a separation layer.

Figure 6G:
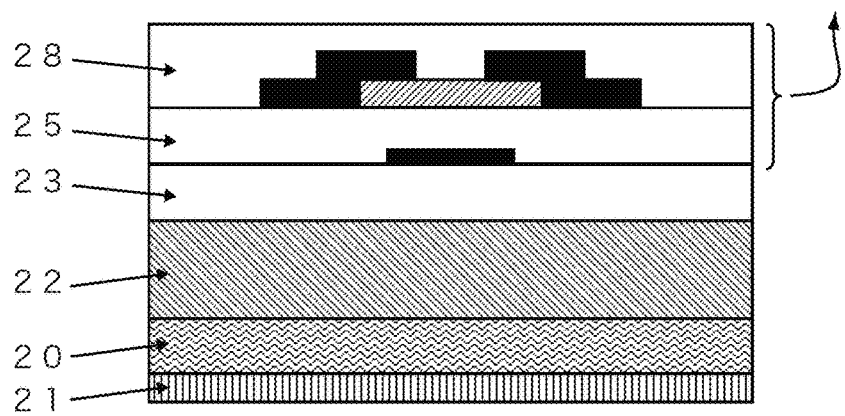
FIG. 6G is a diagram illustrating the manufacturing method according to the first example of the fourth embodiment of the invention.

Through the above-mentioned processes, a flexible thin-film device including the oxide semiconductor thin-film transistors is embodied as illustrated in FIG. 6G. The structure of the thin-film transistor is not limited to the bottom-gate staggered type illustrated in the drawing, but can employ an arbitrary structure such as a bottom-gate planar type, a top-gate staggered type, or a top-gate planar type. Here, it is important that the dense silicon oxide film 20 is formed at a high temperature of 350° C. and thus has a high film density and high barrier capability against infiltration of moisture from the outside. As a result of X-ray reflectance analysis, the film density of the dense silicon oxide film 20 formed at 350° C. is 2.25 g/cm$^3$ and the film density is improved up to 2.27 g/cm$^3$ by performing an annealing process of 400° C. after the film is formed in the state illustrated in FIG. 6B, which is close to the value of a thermal oxide film. Accordingly, it is preferable that the film density of the dense silicon oxide film 20 be equal to or greater than 2.25 g/cm$^3$. When the film density of a silicon oxide film decreases to 2.15 g/cm$^3$, the barrier capability against external moisture decreases, which is not practical. In the related art, when a silicon oxide film is formed as a barrier film on a resin substrate at a low temperature of, for example, 200° C., at most a film density of about 2.10 g/cm$^3$ is obtained and the barrier capability is not insufficient. However, in the disclosure, the dense silicon oxide film 20 having a high film density close to that of a thermal oxide film can be used as a barrier film and thus a flexible thin-film device having very stable characteristics can be manufactured.

The disclosure is also characterized in that the silicon oxide surface layer 21 containing germanium is present on the surface of the dense silicon oxide film 20 having a high density. When the dense silicon oxide film 20 is formed on germanium oxide at 350° C., the germanium concentration in the silicon oxide surface layer 21 is $1 \times 10^{20}$ cm$^{-3}$ which is a maximum value as a measurement result using a secondary ion mass spectrometry method (SIMS method). The maximum value of the germanium concentration in the surface layer varies depending on a film formation temperature of the silicon oxide film formed thereon or an annealing temperature after the film formation, is $1 \times 10^{18}$ cm$^{-3}$ at 300° C., and is $1 \times 10^{21}$ cm$^{-3}$ at 400° C. Accordingly, the germanium concentration in the surface layer is preferably equal to or greater than $1 \times 10^{18}$ cm$^{-3}$. The chemical bonding state of the surface layer is measured using the X-ray photoelectron spectroscopy (XPS) and spectrums for Ge3d core levels are analyzed. As a result, it is confirmed that a peak appears in the vicinity of 32 eV to 33 eV higher by about 3 eV than 29.3 eV which is a peak position of metal Ge, and at least germanium chemically bonded in the form of Ge—O is present in the surface layer. The presence of the surface layer containing germanium can effectively serve to improve the barrier capability.

In this example, the thin-film element 15 is an oxide semiconductor thin-film transistor, but the thin-film element 15 may be a thin-film transistor using amorphous silicon, polycrystalline silicon, microcrystalline silicon, or organic semiconductor or may be a thin-film diode. Not limited to the thin-film transistor, the thin-film element 15 may be a thin-film solar cell using PIN junction of silicon or a thin-film solar cell formed of chalcopyrite-based compound such as Cu—In—S or Cu—In—Se.

In this example, a structure in which the silicon oxide surface layer 21 containing germanium is present on the surface of the dense silicon oxide film 20 is described, but when the barrier capability of the dense silicon oxide film 20 is sufficiently high, the silicon oxide surface layer 21 containing germanium can be removed. The surface layer containing germanium can be removed by plasma etching using fluorine-based gas or chlorine-based gas or wet etching using an acid solution. The removal of the surface layer containing germanium can be applied to the following examples and embodiments.

In this example, the glass substrate 18 is separated after the oxide semiconductor thin-film transistor is formed, but the glass substrate may be separated after the oxide semiconductor thin-film transistor is formed and then a display element, an electrochemical element, and the like are formed thereon to form a thin-film element 15 having a certain function. This separation can be applied to the following examples and embodiments.

While it has been described that the germanium oxide film 19 is used as the separation layer 11, a molybdenum film may be used as the separation layer 11. In this case, a surface layer containing molybdenum is formed on the surface of the dense inorganic barrier film.

Second Example

In FIGS. 6A to 6G, germanium oxide is used for the separation layer 11, and the glass substrate 18 is separated using water solubility of the germanium oxide film 19 after the thin-film element 15 is formed. A hydrogenated amorphous silicon film can be used as the separation layer 11 instead of using the water-soluble metal oxide film. In this case, in the process of FIG. 6F, an excimer laser beam of halogen-based gas such as XeCl is applied from the rear side of the glass substrate 18 and the glass substrate can be separated using ablation of the hydrogenated amorphous silicon film. In this case, the above-mentioned surface layer is not formed or a surface layer including a silicon film may remain.

Third Example

Figure 7:
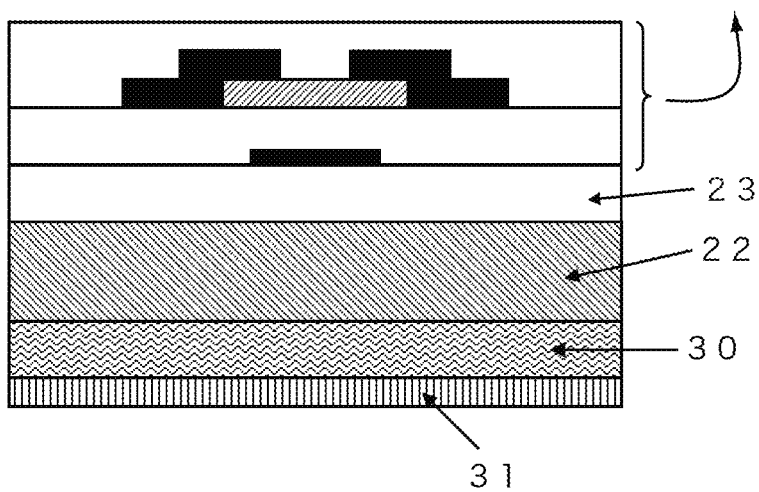
FIG. 7 is a cross-sectional view illustrating a structure according to a third example of the fourth embodiment of the invention.

FIG. 7 is a cross-sectional view illustrating a structure according to a third example of the fourth embodiment of the present disclosure. A manufacturing method according to the third example will be described below with reference to FIG. 7. Here, a dense silicon nitride film 30 is formed on the germanium oxide film 19 at 350° C. using a plasma CVD method. The film density of the dense silicon nitride film 30 formed at 350° C. is 2.70 g/cm$^3$ as a result of X-ray photoelectron spectroscopy (XPS) and the film density is improved up to 2.73 g/cm$^3$ by performing an annealing process at 400° C. after the film is formed. Accordingly, the film density of the dense silicon nitride film 30 is preferable equal to or greater than 2.70 g/cm$^3$. At this time, a silicon nitride surface layer 31 containing germanium is formed in the interface between the germanium oxide film 19 and the dense silicon nitride film 30. Thereafter, through the same processes as illustrated in FIGS. 6A to 6G, a silicon thin-film transistor is formed as the thin-film element 15 and the glass substrate 18 is separated using a dissolution operation of germanium oxide in hot water, thereby a flexible silicon thin-film transistor device is manufactured.

Here, the silicon nitride surface layer 31 containing germanium is present on the surface of the dense silicon nitride film 30. When the silicon nitride film is formed on germanium oxide at 350° C., the germanium concentration in the silicon nitride surface layer 31 is $5 \times 10^{20}$ cm$^{-3}$ which is a maximum value as a measurement result using a SIMS method. The maximum value of the germanium concentration in the surface layer varies depending on a film formation temperature of the silicon nitride film formed thereon or an annealing temperature after the film formation, is $1 \times 10^{18}$ cm$^{-3}$ at 300° C., and is $3 \times 10^{21}$ cm$^{-3}$ at 400° C. Accordingly, the germanium concentration in the surface layer is preferably equal to or greater than $1 \times 10^{18}$ cm$^{-3}$. The chemical bonding state of the surface layer is measured using the X-ray photoelectron spectroscopy (XPS) and spectrums for Ge3d core levels are analyzed. As a result, it is confirmed that a peak appears in the vicinity of 34 eV to 35 eV higher by about 5 eV than 29.3 eV which is a peak position of metal Ge, and at least germanium chemically bonded in the form of Ge—N is present in the surface layer. The presence of the surface layer containing germanium can effectively serve to improve the barrier capability.

Here, hydrogenated amorphous silicon which is formed as a film using the plasma CVD method or polysilicon which is obtained by crystallizing amorphous silicon using laser annealing or thermal annealing can be used as silicon semiconductor. The structure of the thin-film transistor is not limited to the structure illustrated in the drawings, but an arbitrary structure such as a bottom-gate planar type, a top-gate staggered type, or a top-gate planar type can be used. The germanium concentration in the silicon nitride surface layer 31 is analyzed using the SIMS method and the same value as in the dense silicon oxide film 20 in the first example is acquired. The dense silicon nitride film 30 having high barrier capability can be formed at 350° C. or higher and the maximum value of the germanium concentration in the silicon nitride surface layer 31 is $1\times10^{20}$ cm$^{-3}$.

The disclosure is not limited to the silicon oxide film and the silicon nitride film in the first to third examples, but the same advantages can be obtained in an aluminum oxide film, a tantalum oxide film, or a hafnium oxide film.

Fourth Example

Figure 8:
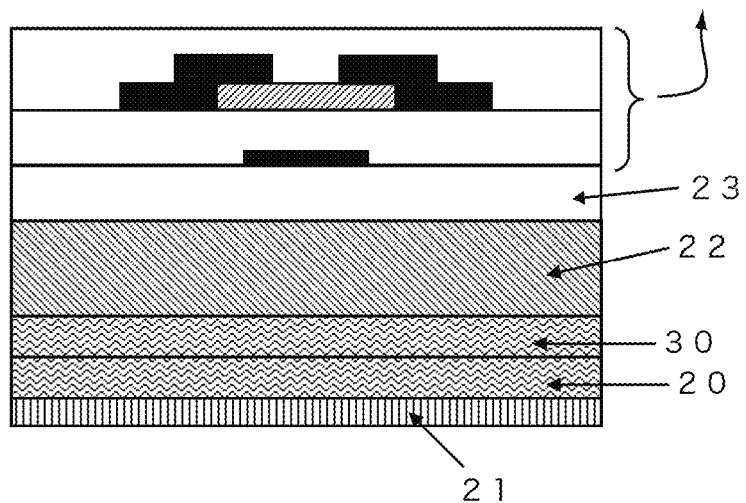
FIG. 8 is a cross-sectional view illustrating a structure according to a fourth example of the fourth embodiment of the invention.

FIG. 8 is a cross-sectional view illustrating a structure according to a fourth example of the fourth embodiment of the disclosure. A manufacturing method according to the fourth example will be described below with reference to FIG. 8. A dense silicon oxide film 20 is formed with a thickness of 200 nm on the germanium oxide film 19 at 350° C. using the plasma CVD method. Subsequently, a dense silicon nitride film 30 is formed with a thickness of 100 nm thereon at 350° C. using the plasma CVD method. Thereafter, an annealing process is performed thereon in air at 400° C. for one hour. The film density of the silicon oxide film is improved to 2.27 g/cm$^3$ by performing the annealing process of 400° C. The film density of the silicon nitride film also increases. A silicon oxide surface layer 21 containing germanium is formed in the interface between the germanium oxide film 19 and the silicon oxide film. Thereafter, through the same processes as illustrated in FIGS. 6A to 6G, an oxide semiconductor thin-film transistor is formed as the thin-film element 15 and the glass substrate 18 is separated using a dissolution operation of germanium oxide in a dilute hydrochloric acid, thereby a flexible oxide semiconductor thin-film transistor device is manufactured.

In this example, since the barrier film has a two-layered structure of the silicon oxide film and the silicon nitride film and both films are subjected to the annealing process of 400° C., there is an advantage that the barrier capability is very high. This two-layered film is more densified to have a higher density than the barrier film (silicon oxide film) 23 formed on the other surface of the polyimide film 22. The barrier film (silicon oxide film) 23 as the first inorganic layer can be arbitrarily stacked (for example, stacking of a silicon oxide film and a silicon nitride film). Here, when the inorganic barrier films containing the same elements are used as at least one layer of the first inorganic layer and the second inorganic layer which are present on both surfaces of the resin layer (polyimide film) 22, the inorganic barrier film used for the second inorganic layer is more densified and has a higher density than the inorganic barrier film used for the first inorganic layer. When the glass substrate 18 is separated by dissolving the germanium oxide film 19, the dilute hydrochloric acid is used. Accordingly, the etching progresses at a high speed which is two times or three times that when hot water is used and productivity is further improved. The disclosure is not limited to the dilute hydrochloric acid, but a dilute acid such as a dilute nitric acid or a dilute oxalic acid may also be used.

Fifth Example

Figure 9A:
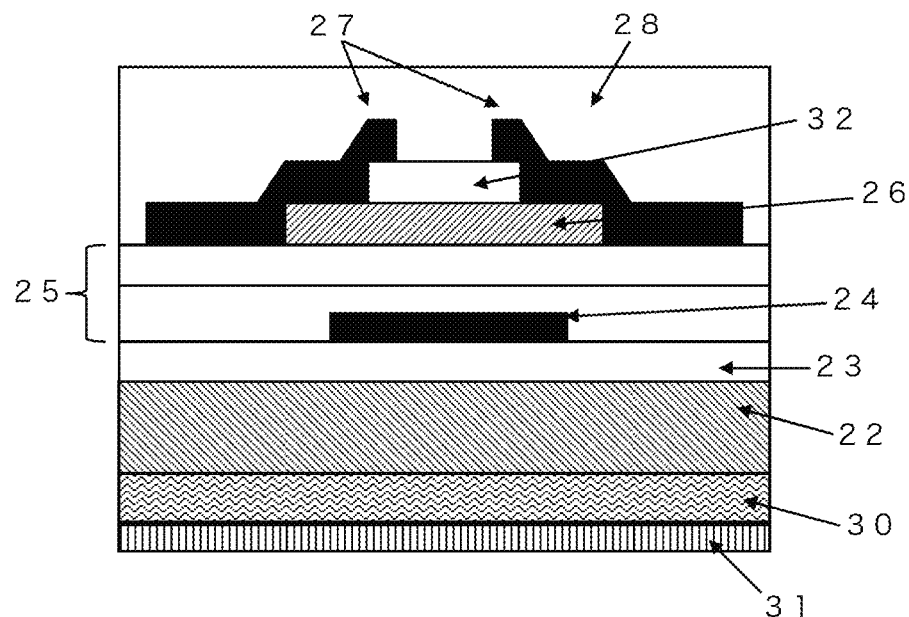
FIG. 9A is a cross-sectional view illustrating a structure according to a fifth example of the invention.

FIGS. 9A to 9D are cross-sectional views illustrating a structure according to a fifth example of the disclosure. A manufacturing method according to the fifth example will be described below with reference to FIGS. 9A to 9D. Here, an etching stop type oxide semiconductor thin-film transistor will be described. FIG. 9A illustrates an example in which a polyimide film 22 is applied or coated. First, similarly to the processes illustrated in FIGS. 6A and 6B, a germanium oxide film 19 is formed on a glass substrate 18, and a dense silicon nitride film 30 is formed with a thickness of 200 nm on the germanium oxide film 19 at 350° C. using the plasma CVD method. Thereafter, In order to further densify the dense silicon nitride film 30, an annealing process is performed in the air at 450° C. for one hour. The film density of the silicon nitride film 30 is improved to 2.75 g/cm$^3$ by performing the annealing process of 450° C. At this time, a silicon nitride surface layer 31 containing germanium is formed in the interface between the germanium oxide film 19 and the dense silicon nitride film 30. By coating the top surface of the dense silicon nitride film 30 with a polyimide material and then performing an annealing process thereon at 200° C. to 350° C., a polyimide film 22 with a thickness of 20 μm is formed. A silicon oxide film with a thickness of 200 nm is formed as a barrier film 23 on the top surface thereof at 350° C. using the plasma CVD method. Subsequently, a gate electrode 24 is formed using aluminum alloy. A silicon nitride film and a silicon oxide film are stacked and formed in this order as a gate insulating film 25 using the plasma CVD method. In addition, an InGaZnO film is formed using a sputtering method and is patterned in a desired shape to form an oxide semiconductor film 26. Thereafter, an annealing process is performed thereon at 400° C. for one hour, then a silicon oxide film is formed at 250° C. using the plasma CVD method, and is patterned in a desired shape to form an etching stop film 32. Subsequently, molybdenum alloy and aluminum alloy are stacked and formed in this order and the resultant film is patterned in a desired shape to form source and drain electrodes 27. A silicon oxide film as the passivation film 28 is formed at 250° C. using the plasma CVD method. After a thin-film transistor element is formed, the glass substrate 18 is separated by dissolving the germanium oxide film 19 using hot water or a dilute acid solution as illustrated in FIG. 6F. Through the above-mentioned processes, the flexible oxide semiconductor thin-film transistor element illustrated in FIG. 9A is manufactured.

As in this example, when the polyimide film 22 is formed by coating, the interface between the polyimide film 22 and the dense silicon nitride film 30 has a structure having a short concave-convex cycle (a cycle of about several nm) which reflects a surface state of the glass substrate 18 or the germanium oxide film 19. On the other hand, the interface between the barrier film 23 and the polyimide film 22 has a structure having a long concave-convex cycle (a cycle of about several hundreds nm to several tens μm) due to thickness irregularity of the polyimide film 22 at the time of coating. The structures having different concave-convex cycles are formed on the top surface and the bottom surface of the polyimide film 22.

Figure 9B:
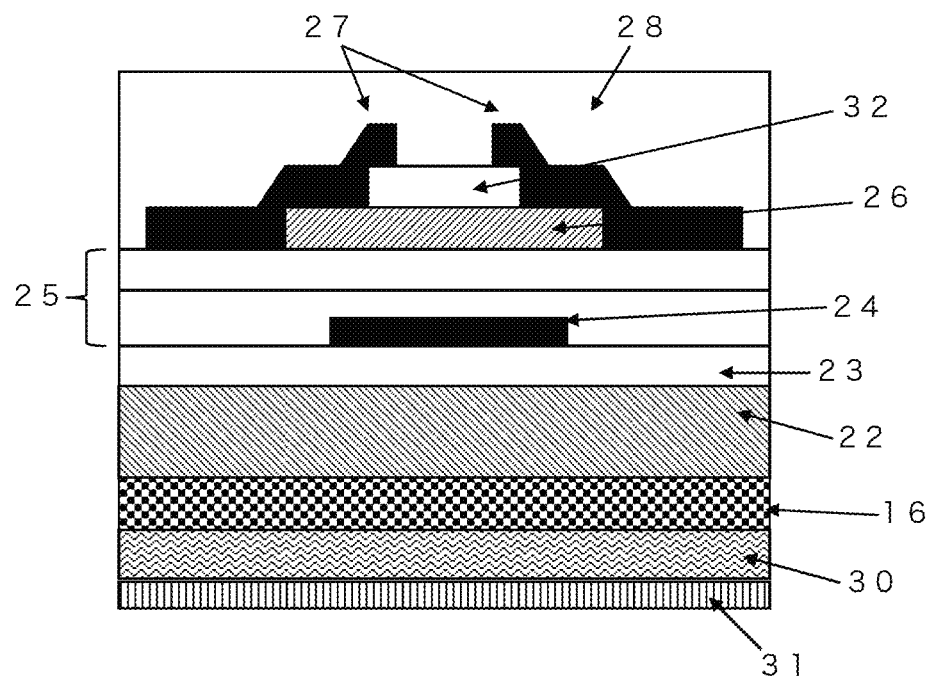
FIG. 9B is a cross-sectional view illustrating the structure according to the fifth example of the invention.

FIG. 9B illustrates an example in which the polyimide film 22 is laminated. Here, a polyimide film 22 formed in a film shape in advance is laminated onto the top surface of the dense silicon nitride film 30 to form the polyimide film 22 with a thickness of 40 μm. At this time, in order to satisfactorily bond the dense silicon nitride film 30 and the polyimide film 22, an adhesive layer 16 is used between the dense silicon nitride film 30 and the polyimide film 22. The other processes are the same as illustrated in FIG. 9A.

Figure 9C:
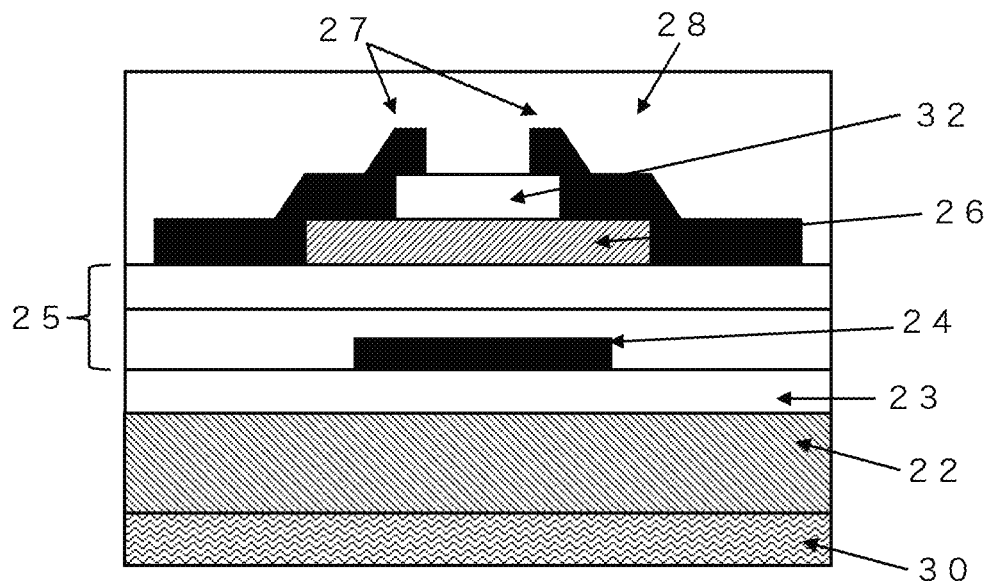
FIG. 9C is a cross-sectional view illustrating the structure according to the fifth example of the invention.
Figure 9D:
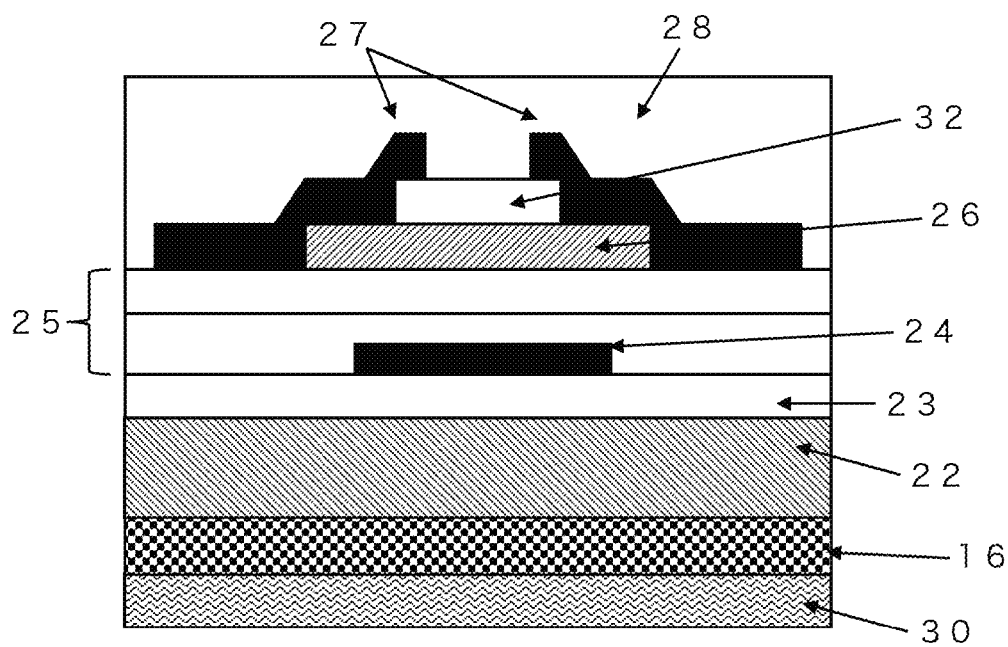
FIG. 9D is a cross-sectional view illustrating the structure according to the fifth example of the invention.

FIGS. 9C and 9D illustrate examples in which the silicon nitride surface layer 31 containing germanium is removed in FIGS. 9A and 9B. The silicon nitride surface layer 31 containing germanium may be removed by etching using a dilute acid solution such as a hydrochloric acid or a nitric acid.

The examples illustrated in FIGS. 9A to 9D represent a structure of an etching stop type oxide semiconductor thin-film transistor. The disclosure is not limited to these examples, but can be applied when a silicon oxide film or an aluminum oxide film is used as the dense inorganic barrier film, when a silicon nitride film or an aluminum oxide film is used as the barrier film 23, when a stacked structure of a silicon oxide film and a silicon nitride film is used as the passivation film 28, or the like.

Sixth Example

Figure 10A:
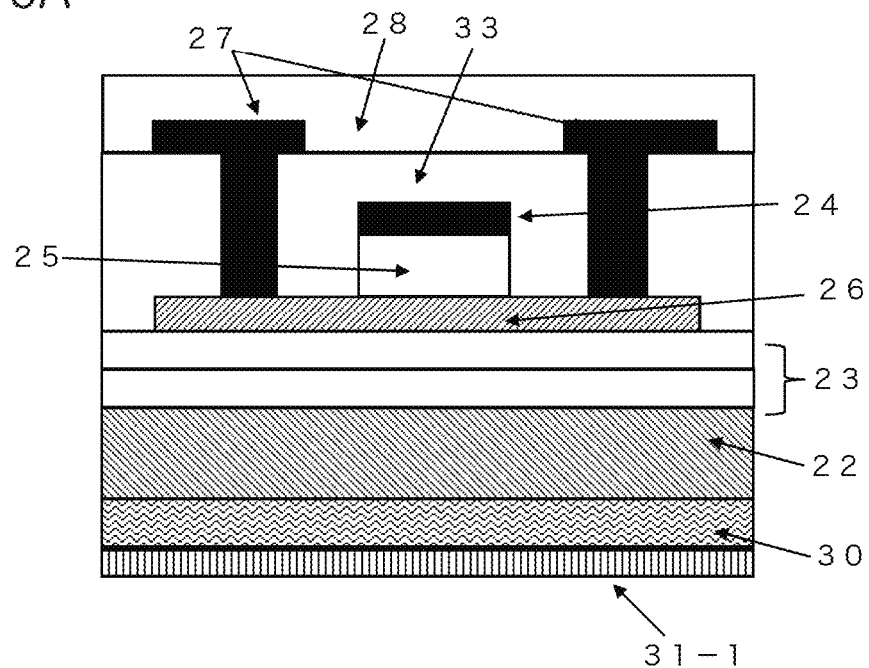
FIG. 10A is a cross-sectional view illustrating a structure according to a sixth example of the invention.
Figure 10B:
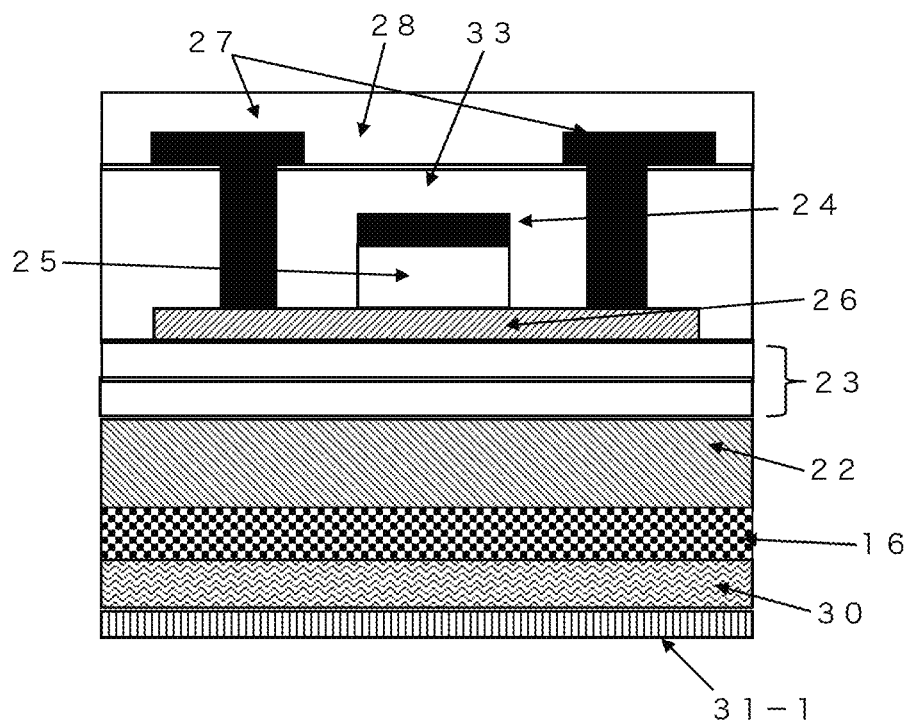
FIG. 10B is a cross-sectional view illustrating the structure according to the sixth example of the invention.

FIGS. 10A and 10B are cross-sectional views illustrating a structure according to a sixth example of the disclosure. A manufacturing method according to the sixth example will be described below with reference to FIGS. 10A and 10B. Here, a top gate type oxide semiconductor thin-film transistor will be described. Similarly to the process illustrated in FIG. 9A, in FIG. 10A, a molybdenum oxide film is formed on a glass substrate 18, and a dense silicon nitride film 30 is formed with a thickness of 200 nm on the molybdenum oxide film at 350° C. using the plasma CVD method. Thereafter, an annealing process is performed in the air at 400° C. for one hour. At this time, a silicon nitride surface layer 31-1 containing molybdenum is formed in the interface between the molybdenum oxide film and the dense silicon nitride film 30. By coating the top surface of the dense silicon nitride film 30 with a polyimide material and then performing an annealing process thereon at 200° C. to 300° C., a polyimide film 22 with a thickness of 20 µm is formed. A silicon nitride film with a thickness of 100 nm and a silicon oxide film with a thickness of 100 nm are formed in this order as a barrier film 23 on the top surface thereof using the plasma CVD method. In the top-gate structure described herein, an oxide semiconductor film 26 is formed on the barrier film. When excessive hydrogen is introduced into the film, the oxide semiconductor film 26 is reduced to markedly decrease the resistivity thereof and does not serve as a channel semiconductor layer of a thin-film transistor. The silicon nitride film formed using the plasma CVD method generally has characteristics that barrier capability against water or sodium is higher and hydrogen with a higher concentration is contained in the film in comparison with a silicon oxide film. Accordingly, as described above, it is effective that the barrier film 23 is formed with a stacked structure of a silicon nitride film and a silicon oxide film, infiltration of moisture or the like to the device side from the polyimide film 22 is suppressed by the silicon nitride film, and infiltration of hydrogen with a high concentration in the silicon nitride film to the device side is suppressed by the silicon oxide film. For this purpose, a plasma CVD method using mixed gas of $SiH_4$ and $N_2O$ as a source material can be suitably used to form the silicon oxide film. In the silicon oxide film formed of the mixed gas of $SiH_4$ and $N_2O$, a nitrogen concentration in the film ranges from $1\times10^{19}$ $cm^{-3}$ to $1\times10^{21}$ $cm^{-3}$ and a carbon concentration in the film is equal to or less than $1\times10^{19}$ $cm^{-3}$. An InGaZnO film is formed on the barrier film 23 having the above-mentioned stacked structure using a sputtering method and is patterned in a desired shape to form an oxide semiconductor film 26. Subsequently, a gate insulating film 25 formed of a silicon oxide film and aluminum alloy are formed and are patterned in a desired shape to form a gate electrode 24. Subsequently, a silicon oxide film is formed as an interlayer film 33 using the plasma CVD method. A contact hole is formed in a desired shape and then a three-layered film of titanium, aluminum alloy, and titanium is formed in this order and is patterned in a desires shape to form source and drain electrodes 27. Subsequently, a silicon nitride film as the passivation film 28 is formed using the plasma CVD method. After a thin-film transistor element is formed, the glass substrate 18 is separated by dissolving the molybdenum oxide film using hot water or a dilute acid solution as illustrated in FIG. 6F. Through the above-mentioned processes, the flexible top-gate type oxide semiconductor thin-film transistor element illustrated in FIG. 10A is manufactured. The dissolution of the molybdenum oxide film progresses at a high speed substantially equal to the dissolution speed of the germanium oxide film 19.

When the silicon nitride film is formed on a molybdenum oxide film at 350° C., the molybdenum concentration in the silicon nitride surface layer 31-1 is $4\times10^{20}$ $cm^{-3}$ which is a maximum value as a measurement result using the SIMS method. The maximum value of the molybdenum concentration in the silicon nitride surface layer 31-1 varies depending on a film formation temperature of the silicon nitride film formed thereon or an annealing temperature after the film formation, is $1\times10^{18}$ $cm^{-3}$ at 300° C., and is $2\times10^{21}$ $cm^{-3}$ at 400° C. Accordingly, the molybdenum concentration in the silicon nitride surface layer 31-1 is preferably equal to or greater than $1\times10^{18}$ $cm^{-3}$. The chemical bonding state of the surface layer is measured using the X-ray photoelectron spectroscopy (XPS) and spectrums for Mo3d core levels are analyzed. As a result, it is confirmed that a peak appears in a high energy side higher by about 3 eV than a peak position of metal Mo, and at least molybdenum chemically bonded in the form of Mo—N is present in the surface layer. The presence of the surface layer containing molybdenum can effectively serve to improve the barrier capability.

In the above-mentioned example, the silicon nitride film is formed on the molybdenum oxide, but a silicon oxide film may be formed instead of the silicon nitride film. In this case, a dense silicon oxide film can be formed on molybdenum oxide by forming a silicon oxide film at a high temperature of 350° C. or higher, preferably, 400° C. or higher or performing a high-temperature annealing process after a silicon oxide film is formed. In the high-temperature process, a silicon oxide surface layer containing molybdenum is formed in the interface between molybdenum oxide and the silicon oxide film by mutual diffusion. The molybdenum concentration in the silicon oxide surface layer is preferably equal to or greater than $1\times10^{18}$ $cm^{-3}$. The chemical bonding state of the surface layer is measured using the X-ray photoelectron spectroscopy (XPS) and spectrums for Mo3d core levels are analyzed. As a result, it is confirmed that a peak appears in a high energy side higher by about 5 eV than a peak position of metal Mo, and at least molybdenum chemically bonded in the form of Mo—O is present in the surface layer. The presence of the surface layer containing molybdenum can effectively serve to improve the barrier capability.

In comparison with FIG. 10A, FIG. 10B illustrates an example in which the polyimide film 22 is laminated. The processes other than the process using an adhesive layer 16 between the dense silicon nitride film 30 and the polyimide film 22 in order to satisfactorily bond the dense silicon nitride film 30 and the polyimide film 22 are the same as described above with reference to FIG. 10A. As illustrated in FIGS. 9C and 9D, the silicon nitride surface layer 31-1 containing molybdenum may be removed in FIGS. 10A and 10B. Even when the molybdenum oxide film is used, the dense inorganic barrier film is not limited to the silicon nitride film, but the same advantages can be obtained from a silicon oxide film, an aluminum oxide film, a tantalum oxide film, or a hafnium oxide film.

Seventh Example

Figure 11A:
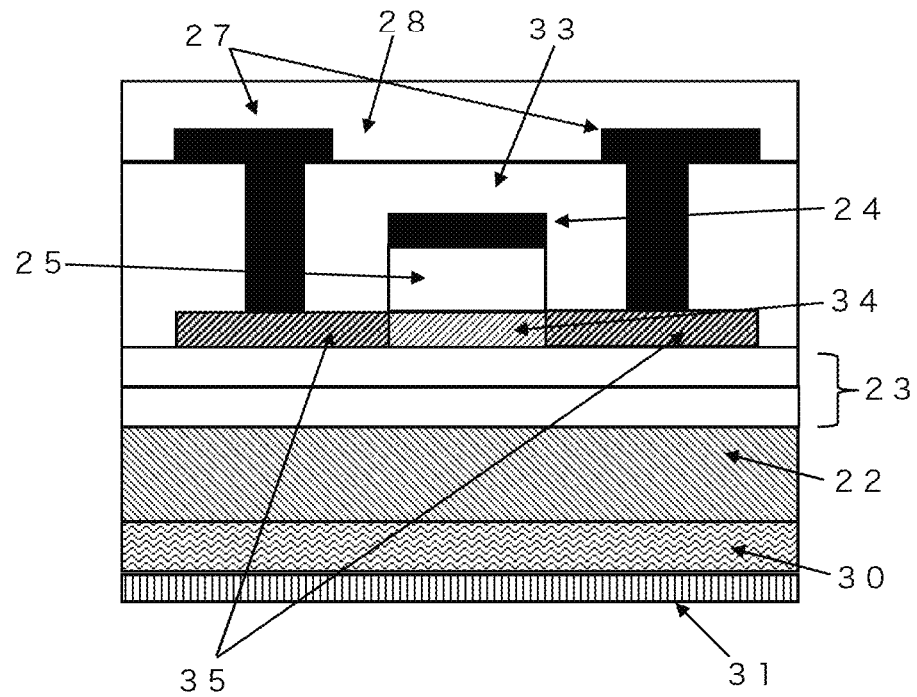
FIG. 11A is a cross-sectional view illustrating a structure according to a seventh example of the invention.
Figure 11B:
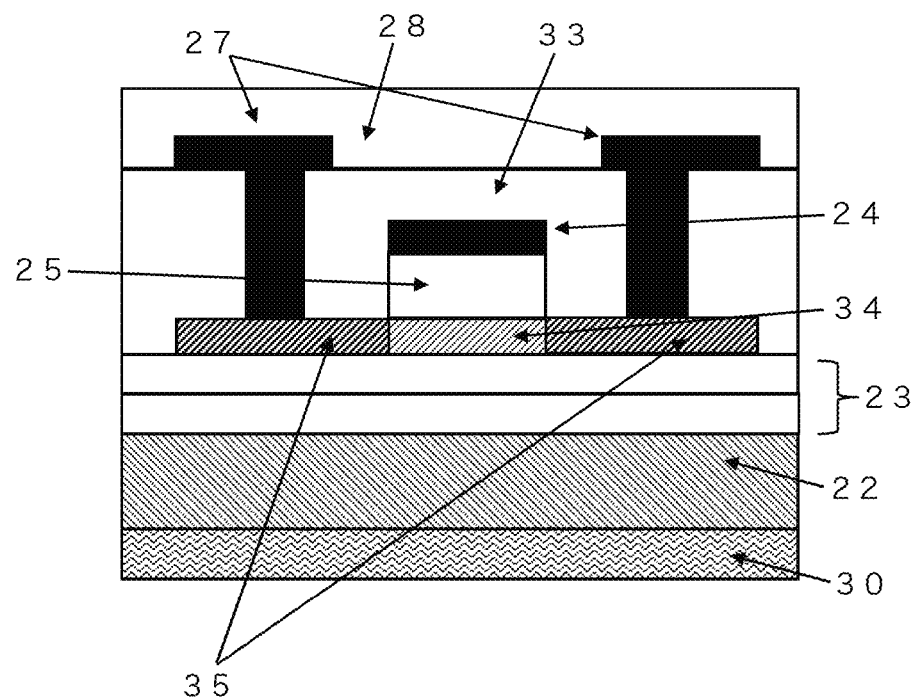
FIG. 11B is a cross-sectional view illustrating the structure according to the seventh example of the invention.

FIGS. 11A and 11B are cross-sectional views illustrating a structure according to a seventh example of the disclosure. A manufacturing method according to the seventh example will be described below with reference to FIGS. 11A and 11B. Here, a top-gate type polycrystalline silicon thin-film transistor will be described. Similarly to the processes illustrated in FIGS. 6A to 6G, a germanium oxide film 19 is formed with a thickness of 1.5 μm on a glass substrate 18, and a dense silicon nitride film 30 is formed with a thickness of 200 nm on the germanium oxide film 19 at 350° C. using the plasma CVD method. Thereafter, an annealing process is performed in the air at 400° C. for one hour. At this time, a silicon nitride surface layer 31 containing germanium is formed in the interface between the germanium oxide film 19 and the dense silicon nitride film 30. By coating the top surface of the dense silicon nitride film 30 with a polyimide material and then performing an annealing process thereon at 250° C. to 350° C., a polyimide film 22 with a thickness of 30 μm is formed. A silicon nitride film and a silicon oxide film are formed in this order as a barrier film 23 on the top surface thereof using a CVD method. An amorphous silicon film is formed on the barrier film using the CVD method and then the amorphous silicon film is irradiated with an excimer laser beam using XeCl gas to reform the amorphous silicon film to a polycrystalline silicon film 34. In the irradiation with a laser beam, as disclosed in Patent Literature 3, there is a possibility that separation will progress from the interface between the polyimide film 22 and the barrier film 23. In this example, it is necessary to prevent separation in the process of forming an element. For this purpose, for example, it is necessary to control energy strength or a thickness of the amorphous silicon film so as to cause the amorphous silicon film to absorb most energy of an irradiation laser beam. Alternatively, it is also effective to control the thickness of the barrier film to effectively decrease laser energy reaching the polyimide film 22 by interference of excimer laser beams. After reforming to the polycrystalline silicon film 34, the resultant film is patterned in a desired island shape. Subsequently, a gate insulating film 25 containing silicon oxide and aluminum alloy are formed and are patterned in a desired shape to form a gate electrode 24. Thereafter, impurities such as phosphorus, boron and the like are doped on a source and drain region using a technique of ion doping, ion implantation, or the like to form a doping layer 35. An interlayer film 33 is formed, a contact hole is formed at a desired position, then a three-layered film of titanium, aluminum alloy, and titanium is sequentially formed in this order and are patterned in a desired shape to form source and drain electrodes 27. Thereafter, a silicon nitride film is formed as the passivation film 28. After a thin-film transistor element is formed, the glass substrate 18 is separated by dissolving the germanium oxide film 19 using hot water or a dilute acid solution as illustrated in FIG. 6F. Through the above-mentioned processes, the flexible top-gate type polycrystalline silicon thin-film transistor element illustrated in FIG. 11A is manufactured. As illustrated in FIG. 11B, the silicon nitride surface layer 31 containing germanium may be removed by etching or the like after the separation.

Eighth Example

Figure 12:
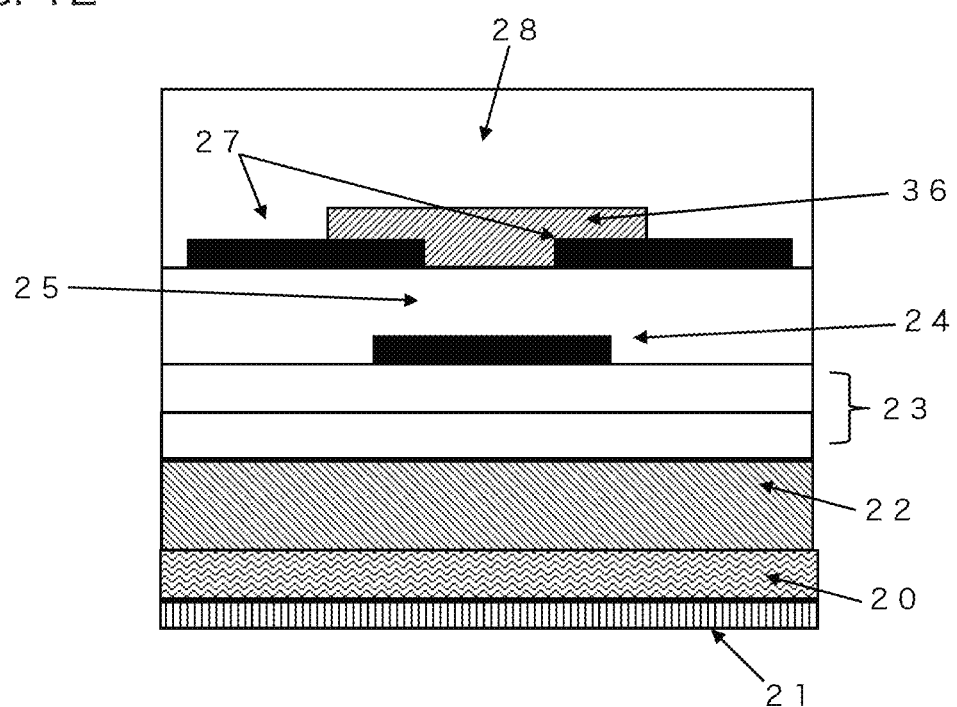
FIG. 12 is a cross-sectional view illustrating a structure according to an eighth example of the invention.

FIG. 12 is a cross-sectional view illustrating a structure according to an eighth example of the disclosure. The eighth example will be described below with reference to FIG. 12. Here, an organic semiconductor thin-film transistor will be described. A germanium oxide film 19 is formed on a glass substrate 18 using a sputtering method. The germanium oxide film 19 is formed with a thickness of 1 μm by performing reactive sputtering film formation under a gas condition of a flow ratio 1:1 of argon gas and oxygen gas using a germanium target. The substrate temperature is not particularly intentionally raised. Thereafter, a dense silicon oxide film 20 as a dense inorganic film is formed with a thickness of 200 nm on the germanium oxide film 19 at a substrate temperature of 350° C. using the plasma CVD method. As a method of forming the silicon oxide film using the plasma CVD method, a method using mixed gas of $SiH_4$ and $N_2O$, a method using mixed gas of TEOS and $O_2$, or the like can be used. When the silicon oxide film is formed at a substrate temperature of 350° C., mutual diffusion of atoms due to heat occurs in the interface between the germanium oxide film 19 and the silicon oxide film, and a silicon oxide surface layer 21 containing germanium is formed on the surface of the silicon oxide film. By coating the top surface of the dense silicon oxide film 20 with a polyimide material and then performing an annealing process thereon at 200° C. to 350° C., a polyimide film 22 with a thickness of 30 μm is formed. A silicon nitride film and a silicon oxide film are formed in this order as a barrier film 23 on the top surface thereof using the plasma CVD method. Subsequently, a stacked film is formed in an order of titanium and gold and is patterned in a desired shape to form source and drain electrodes 27. Thereafter, a pentacene film is formed using a deposition method and is patterned in a desired island shape to form an organic semiconductor film 36. Thereafter, an acryl resin and a silicon nitride film are stacked and formed in this order as the passivation film 28. After a thin-film transistor element is formed, the glass substrate 18 is separated by dissolving the germanium oxide film 19 using hot water or a dilute acid solution as illustrated in FIG. 6F. Through the above-mentioned processes, the organic semiconductor thin-film transistor element illustrated in FIG. 12 is manufactured.

The organic semiconductor film 36 is not limited to a low-molecular-weight material which is formed as a film using the same deposition method as pentacene, but a high-molecular-weight material which can be used for application, coating, or inkjet printing can be used.

Fifth Embodiment

Figure 13A:
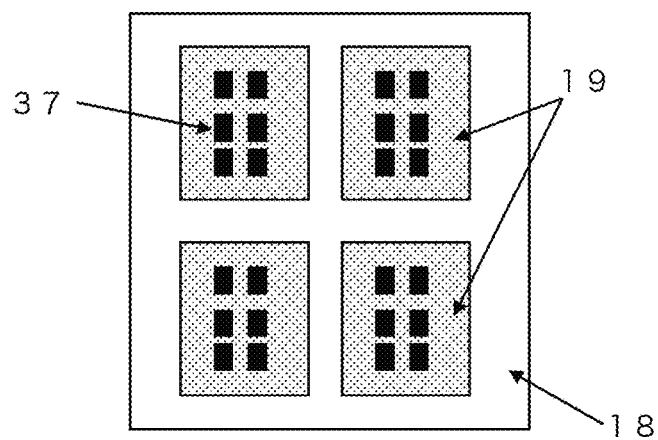
FIG. 13A is a plan view illustrating a method of manufacturing a thin-film device according to a fifth embodiment of the invention.
Figure 13B:
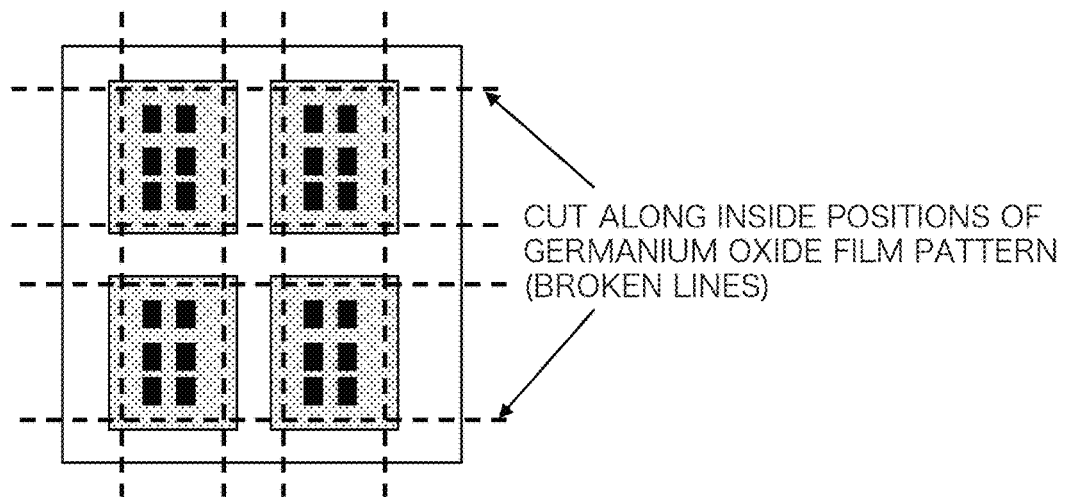
FIG. 13B is a plan view illustrating the method of manufacturing the thin-film device according to the fifth embodiment of the invention.
Figure 13C:
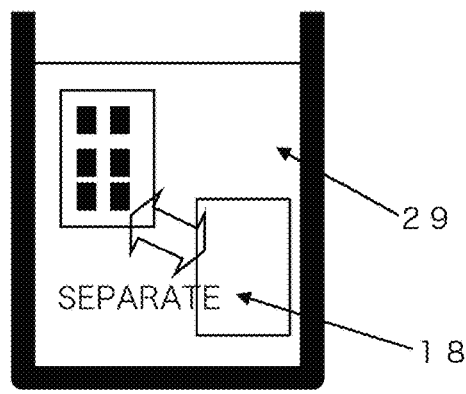
FIG. 13C is a plan view illustrating the method of manufacturing the thin-film device according to the fifth embodiment of the invention.

FIGS. 13A to 13C are diagrams illustrating a method of manufacturing a thin-film device according to a fifth embodiment of the disclosure. FIGS. 1 to 12 illustrate cross-sectional structures of the devices, but FIGS. 13A and 13B illustrate a planar structure of a device when viewed from the top side. As illustrated in FIG. 13A, a germanium oxide film 19 is formed in only desired parts of a glass substrate 18 (four rectangular parts in the drawing). A germanium oxide film may be selectively formed in only desired parts using a metal mask or the like, or the germanium oxide film 19 may be formed on the entire surface of the glass substrate 18 and may be etched using photolithography to process the germanium oxide film 19 in a desired shape. Thereafter, a dense silicon oxide film 20 is formed with a thickness of 200 nm on the entire surface of the glass substrate 18 at 400° C. so as to cover the germanium oxide film 19. A polyimide film 22 with a thickness of 70 μm as a resin layer 13 is formed on the dense silicon oxide film 20. As the method of forming the polyimide film 22, a method of forming the polyimide film 22 by applying and baking a source solution, a method of laminating a film-like polyimide film 22 formed in advance onto the dense silicon oxide film 20, or the like can be used.

Similarly to the first example, an oxide semiconductor thin-film transistor 37 as the thin-film element 15 is formed on the polyimide film 22. At this time, the oxide semiconductor thin-film transistor 37 is formed inside a pattern of a germanium oxide film 19 which is partially formed. Since a silicon oxide film is formed on the entire surface of the patterned germanium oxide film 19, a part in which germanium oxide is exposed to the air in the course of manufacturing the thin-film transistor is not present. Accordingly, germanium oxide is not dissolved in the course of manufacturing the thin-film transistor.

Thereafter, as illustrated in FIG. 13B, the substrate is cut into pieces along positions inside the pattern of the germanium oxide film 19 (cut along the broken lines). By cutting the substrate in this way, germanium oxide is exposed from end faces of the substrate. Thereafter, as illustrated in FIG. 13C, when the cut pieces are immersed in hot water, germanium oxide is dissolved at a high speed from the exposed end faces, the glass substrate 18 is separated, and pieces of flexible thin-film transistor elements are completed. These pieces of thin-film transistor elements can be used as unit devices having a certain function such as a display of a smartphone or a tablet terminal. In the examples illustrated in FIGS. 1 to 12, the thin-film devices can be manufactured by dividing the thin-film devices into pieces as illustrated in FIGS. 13A to 13C.

Sixth Embodiment

Figure 14:
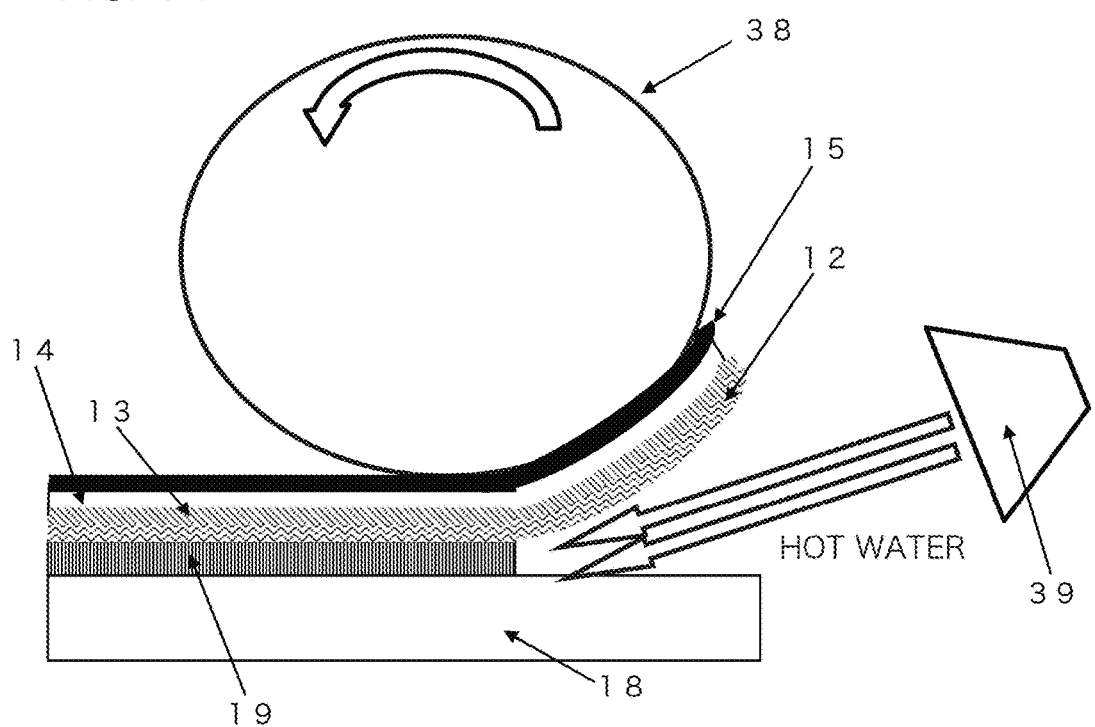
FIG. 14 is a cross-sectional view illustrating a method of manufacturing a thin-film device according to a sixth embodiment of the invention.

FIG. 14 is a diagram illustrating a method of manufacturing a thin-film device according to a sixth embodiment of the disclosure. The method illustrated in FIGS. 13A to 13C can be used to manufacture a piece of flexible device, but a long time is required for horizontally etching the germanium oxide film 19 in the case of a large-area device. In this case, as illustrated in FIG. 14, a method of supplying hot water to the germanium oxide film 19 as a separation point from a mechanism 39 supplying hot water while bringing a surface of a thin-film element 15 into close contact with a roller 38 and winding up the surface can be effectively used. In the example illustrated in FIGS. 13A to 13C, the germanium oxide film 19 is etched by infiltration of hot water in a horizontal direction, but in the example illustrated in FIG. 14, hot water can be actively supplied to the germanium oxide film 19 of a separation interface and it is thus possible to effectively increase the separation speed.

Seventh Embodiment

Figure 15:
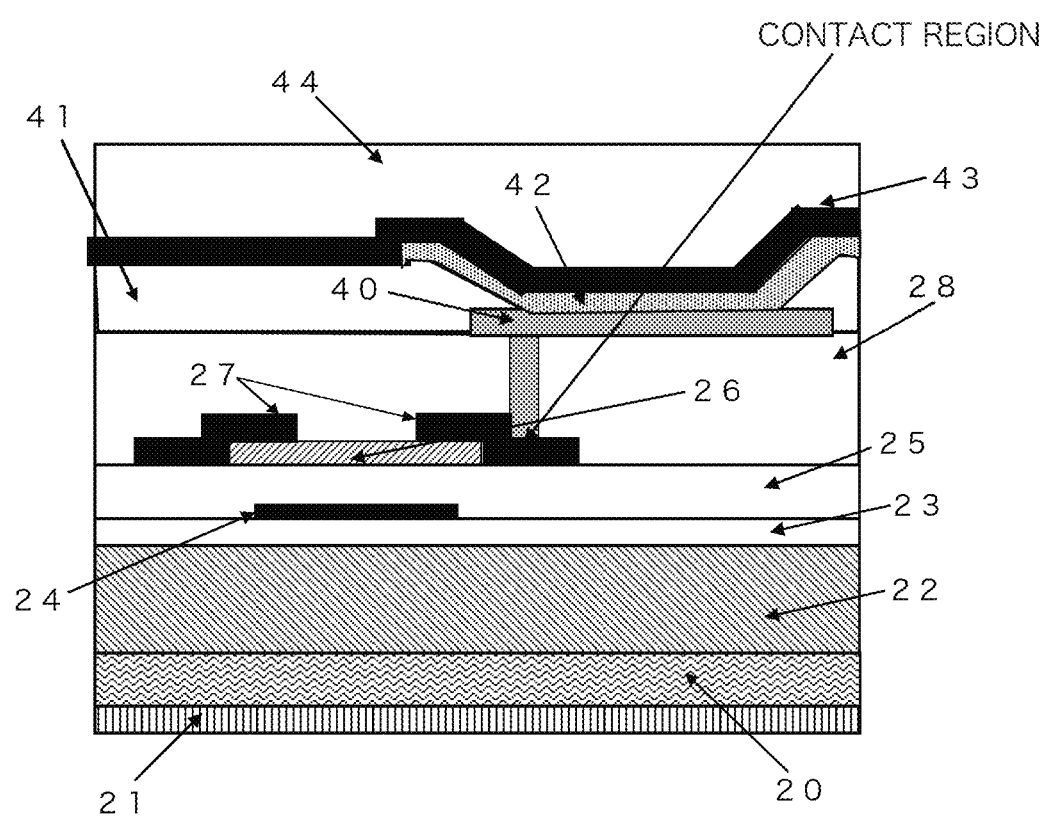
FIG. 15 is a diagram schematically illustrating a cross-sectional structure of a pixel of an oxide semiconductor thin-film transistor flexible organic EL display as a flexible thin-film device according to a seventh embodiment of the invention.

FIG. 15 is a diagram schematically illustrating a cross-sectional structure of a pixel of an oxide semiconductor thin-film transistor flexible organic EL display as a flexible thin-film device according to a seventh embodiment of the disclosure. On the basis of the processes described with reference to FIGS. 6A to 6G, an oxide semiconductor thin-film transistor array is formed on a polyimide substrate. Thereafter, a source or drain electrode 27 and an anodic electrode 40 are electrically connected to each other via a pixel contact region. A pixel isolating layer 41 is formed and then an organic EL layer 42 including an electron transporting layer, a hole transporting layer, and a light-emitting layer is formed. A cathodic electrode 43 is formed on the organic EL layer 42. For the purpose of realizing colors, the organic EL layers 42 of pixels may have blue, green, and red light emitting functions, or the organic EL layers 42 of the pixels may have a white light emitting function and blue, green, and red colors may be realized by forming particularly color filter layers (for the purpose of convenience, color filter layers are not illustrated in FIG. 15). Emission of light may be of a bottom emission type or a top emission type, and materials of the cathodic electrode and the anodic electrode are used properly. Finally, a sealing layer 44 is formed of an organic material or an inorganic material.

Figure 16:
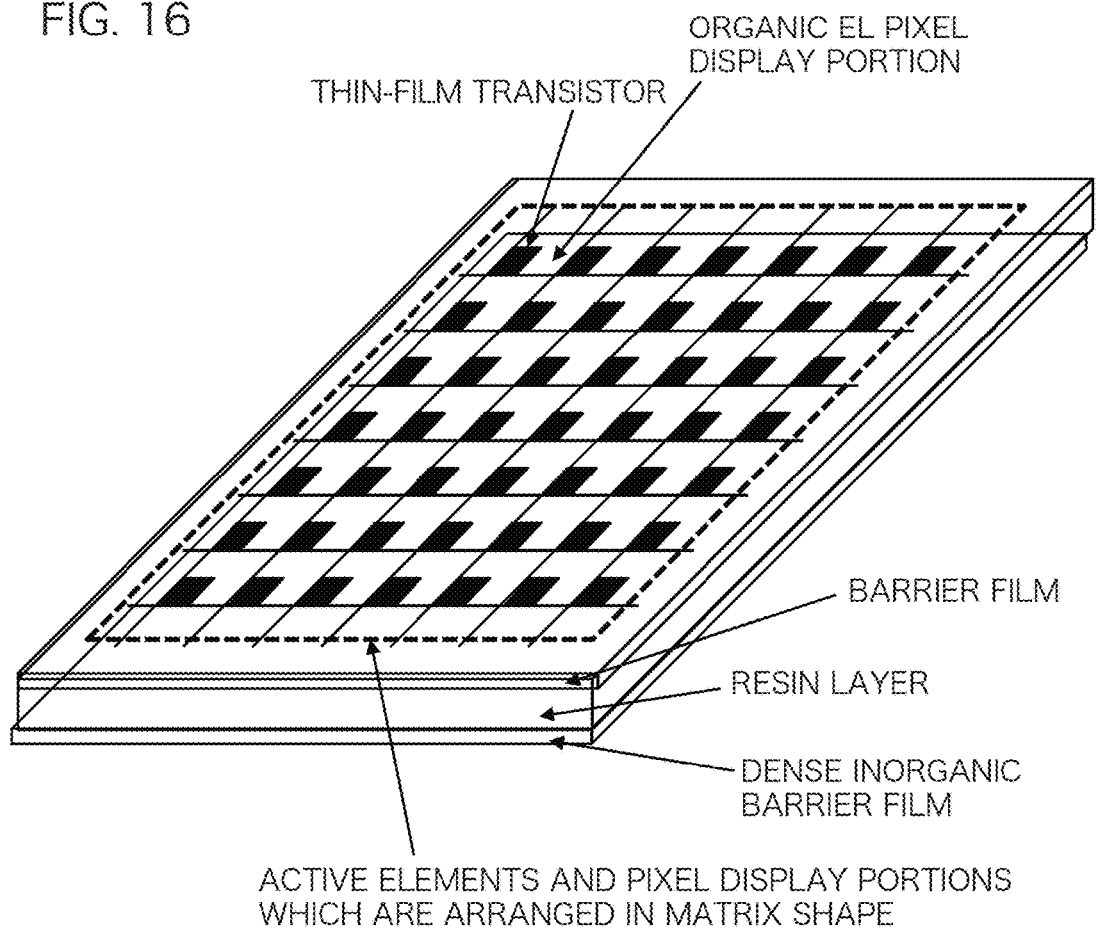
FIG. 16 is a diagram schematically illustrating a flexible organic EL display including thin-film transistors and pixel display portions which are arranged in a matrix shape according to the seventh embodiment of the invention.

In this way, a flexible organic EL display is manufactured by forming a thin-film transistor and an organic EL element as a unified body and then immersing the resultant structure in hot water to separate the glass substrate 18 using dissolution of a germanium oxide film. For example, FIG. 16 schematically illustrates a flexible organic EL display in which thin-film transistors and organic EL pixel display portions are arranged in a matrix shape of 7×7). A dense inorganic barrier film is formed on one surface of the resin layer 13, and a barrier film, a thin-film transistor, and an organic EL pixel display portion are formed on the other surface.

In the flexible organic EL display according to the disclosure, the dense silicon oxide film 20 with a high density formed or processed at a high temperature is present on the rear surface of the polyimide film 22, and the silicon oxide surface layer 21 containing germanium is also present. Accordingly, it is possible to considerably improve the barrier capability against infiltration of impurities from the outside and to manufacture a flexible organic EL display with high reliability.

Eighth Embodiment

Figure 17:
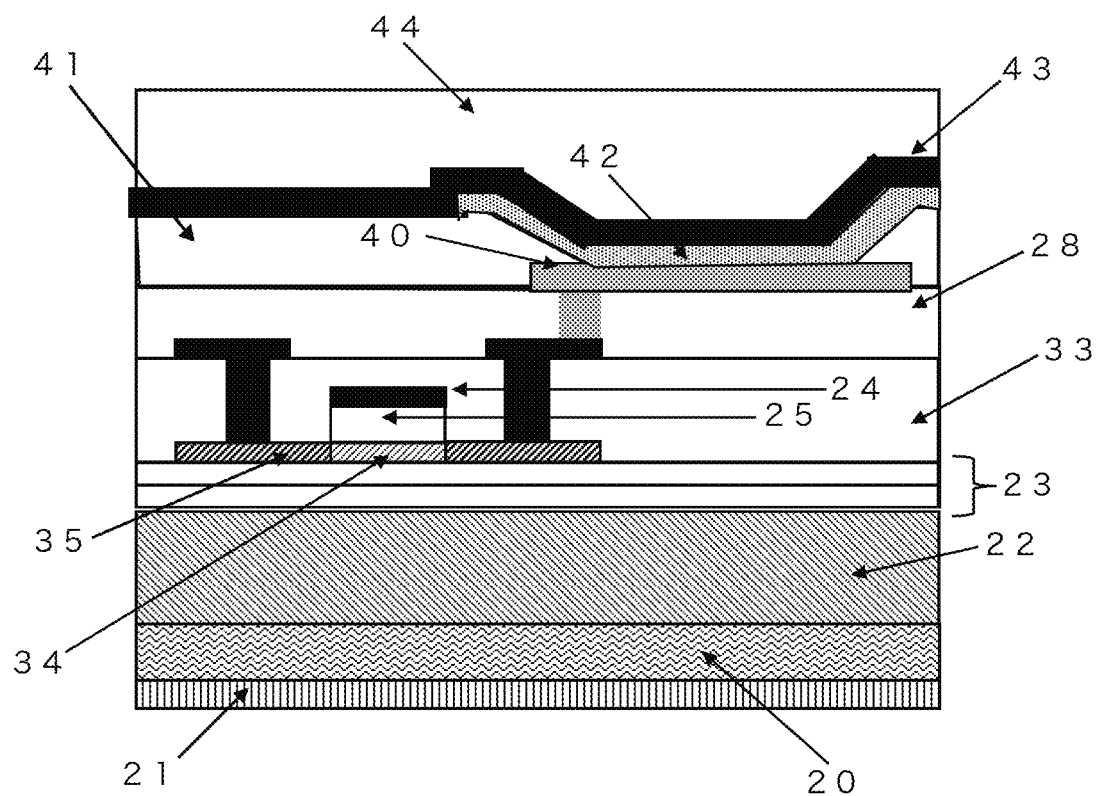
FIG. 17 is a diagram schematically illustrating a cross-sectional structure of a pixel of a polycrystalline silicon thin-film transistor flexible organic EL display as a flexible thin-film device according to an eighth embodiment of the invention.

FIG. 17 is a diagram schematically illustrating a cross-sectional structure of a pixel of a polycrystalline silicon thin-film transistor flexible organic EL display as a flexible thin-film device according to an eighth embodiment of the disclosure. On the basis of the processes described with reference to FIGS. 11A and 11B, a polycrystalline silicon thin-film transistor array is formed on a polyimide substrate. Thereafter, a source or drain electrode 27 and an anodic electrode 40 are electrically connected to each other via a pixel contact region. A pixel isolating layer 41 is formed and then an organic EL layer 42 including an electron transporting layer, a hole transporting layer, and a light-emitting layer is formed. A cathodic electrode 43 is formed on the organic EL layer 42. For the purpose of realizing colors, the organic EL layers 42 of pixels may have blue, green, and red light emitting functions, or the organic EL layers 42 of the pixels may have a white light emitting function and blue, green, and red colors may be realized by forming particularly color filter layers (for the purpose of convenience, color filter layers are not illustrated in FIG. 16). Emission of light may be of a bottom emission type or a top emission type, and materials of the cathodic electrode and the anodic electrode are used properly. Finally, a sealing layer 44 is formed of an organic material or an inorganic material.

In this way, a flexible organic EL display is manufactured by forming a polycrystalline silicon thin-film transistor and a display portion including an organic EL as a unified body and then immersing the resultant structure in hot water to separate the glass substrate 18 using dissolution of the germanium oxide film 19.

In the flexible organic EL display according to the disclosure, the dense silicon oxide film 20 with a high density formed or processed at a high temperature is present on the rear surface of the polyimide film 22, and the silicon oxide surface layer 21 containing germanium is also present. Accordingly, it is possible to considerably improve the barrier capability against infiltration of impurities from the outside and to manufacture a flexible organic EL display with high reliability.

Ninth Embodiment

Figure 18:
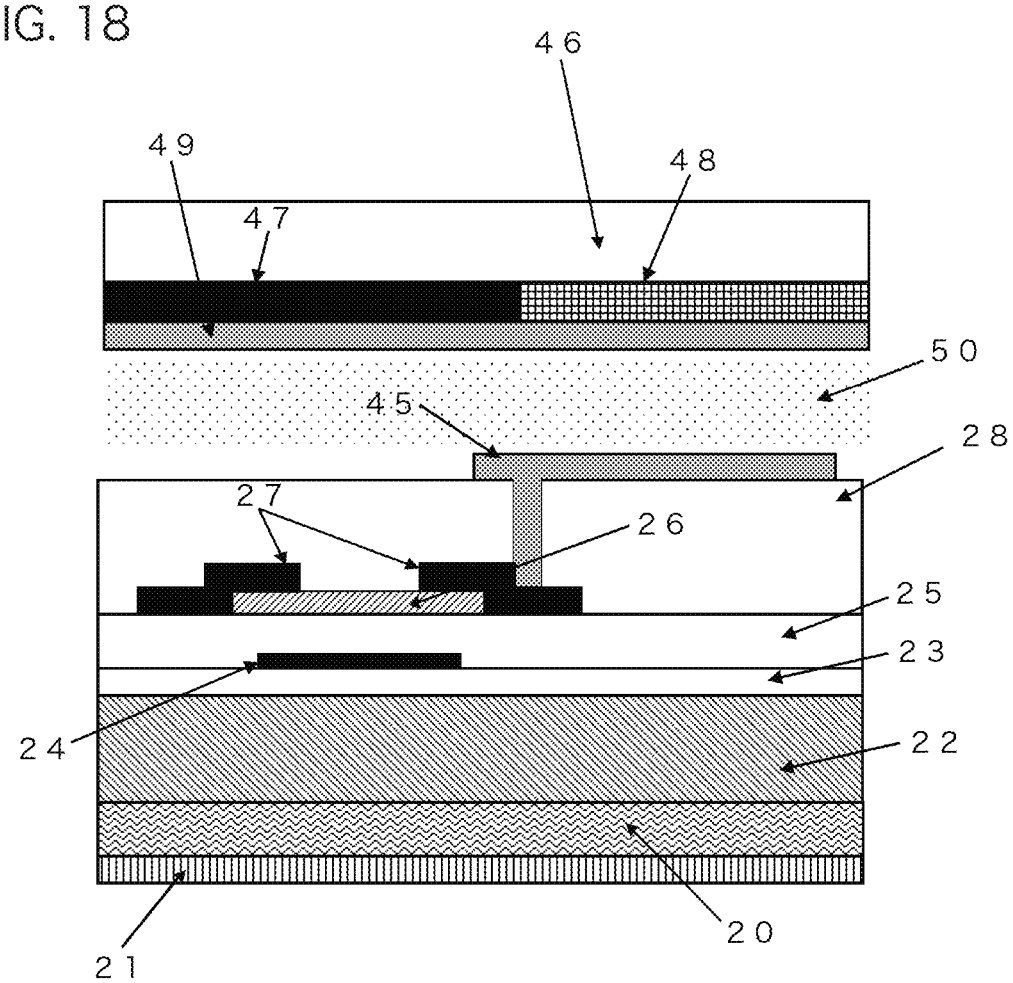
FIG. 18 is a diagram schematically illustrating a cross-sectional structure of a pixel of a flexible liquid crystal display according to a ninth embodiment of the invention.

FIG. 18 is a diagram schematically illustrating a cross-sectional structure of a pixel of a flexible liquid crystal display according to a ninth embodiment of the disclosure. A source or drain electrode 27 and a pixel electrode 45 are electrically connected to each other via a contact region. A black matrix 47, a color filter pigment layer 48, and a counter electrode 49 are formed on an insulating substrate 46, and liquid crystal 50 is interposed between another substrate having an oxide semiconductor thin-film transistor formed thereon and the insulating substrate. In practice, an alignment film is formed on the surfaces of the upper and lower substrates facing the liquid crystal 50, but the alignment film is omitted herein for the purpose of convenience. The upper and lower substrates are bonded by a sealant in the peripheries thereof to enclose the liquid crystal 50 therebetween, but the sealant is omitted herein for the purpose of convenience.

In this way, a thin-film transistor and a display portion including a color filter are formed as a unified body, bonding is performed with the sealant, and then the resultant structure is immersed in hot water to separate the glass substrate 18 using dissolution of the germanium oxide film 19. Accordingly, a light liquid crystal display can be formed and a flexible liquid crystal display can be manufactured, particularly, using a resin substrate as the insulating substrate 46 on the color filter side.

Figure 19:
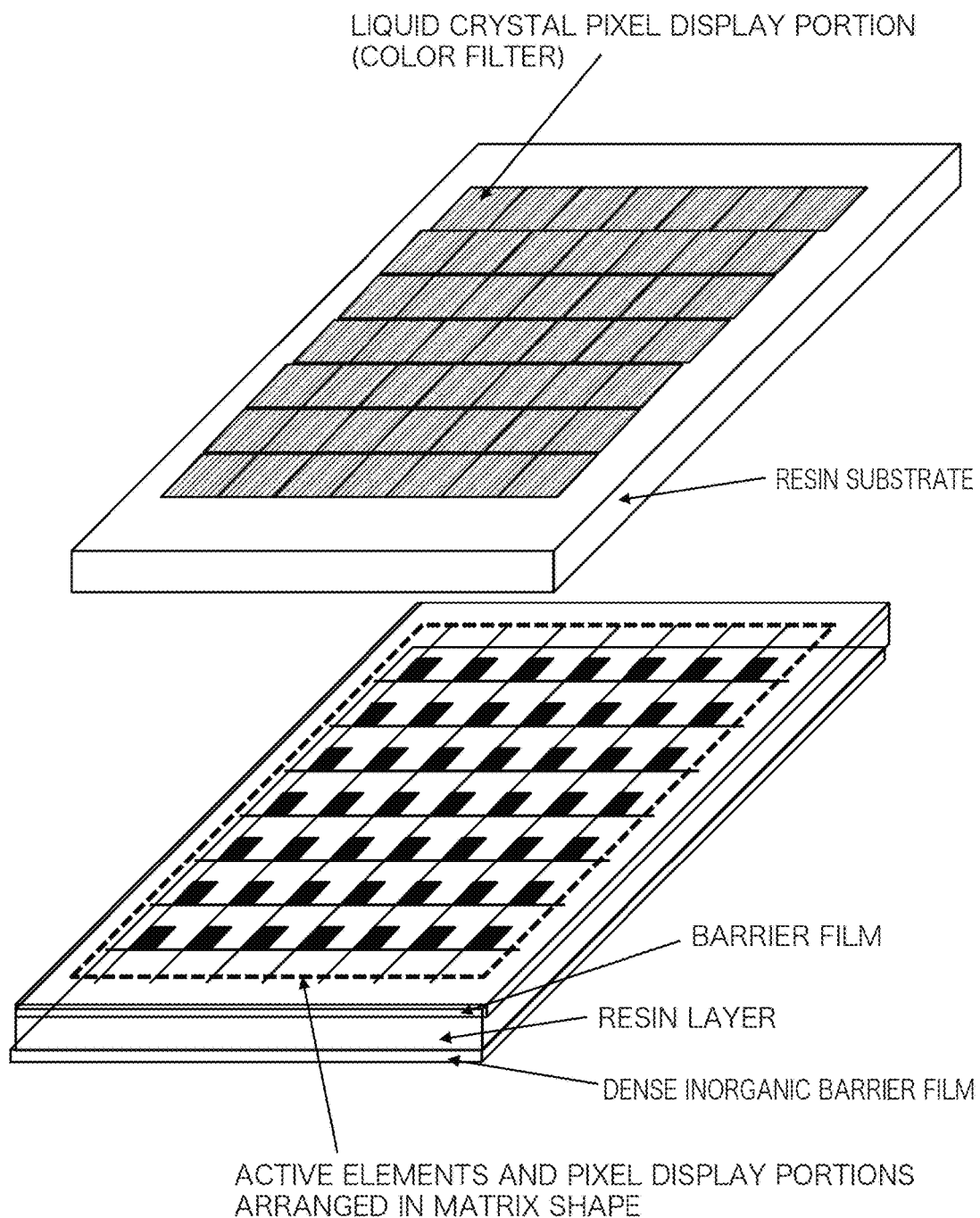
FIG. 19 is a diagram schematically illustrating a flexible liquid crystal display including thin-film transistors and pixel display portions which are arranged in a matrix shape according to the ninth embodiment of the invention.

For example, FIG. 19 schematically illustrates a flexible substrate in which thin-film transistors are arranged in a matrix shape of 7×7 and a resin substrate in which liquid crystal pixel display portions (color filters) are arranged at positions corresponding to the thin-film transistors. A dense inorganic barrier film is formed on one surface of the resin layer of the flexible substrate in which the thin-film transistors are arranged, and a barrier film and thin-film transistors are formed on the other surface. Then, by bonding the flexible substrate to the resin substrate in which the liquid crystal pixel display portions (color filters) are arranged, the flexible liquid crystal display is manufactured.

In the flexible liquid crystal display according to the disclosure, the dense silicon oxide film 20 with a high density formed or processed at a high temperature is present on the rear surface of the polyimide film 22, and the silicon oxide surface layer 21 containing germanium is also present. Accordingly, it is possible to considerably improve the barrier capability against infiltration of impurities from the outside and to manufacture a flexible organic EL display with high reliability.

While the liquid crystal displays and the organic EL displays using the oxide semiconductor thin-film transistors or the polycrystalline silicon thin-film transistors according to the disclosure have been described above, the disclosure is not limited thereto. Arbitrary combinations of an oxide semiconductor thin-film transistor or an amorphous silicon thin-film transistor in which oxide semiconductor is replaced with amorphous silicon, an active element such as a polycrystalline silicon thin-film transistor or an organic semiconductor thin-film transistor, an organic EL display element, and a liquid crystal display element can be used. The disclosure can be used for various displays such as an electrophoretic display using various thin-film transistors for driving electronic ink or a micro electromechanical systems (MEMS) display using various thin-film transistors for controlling a distance between two films.

Tenth Embodiment

Figure 20:
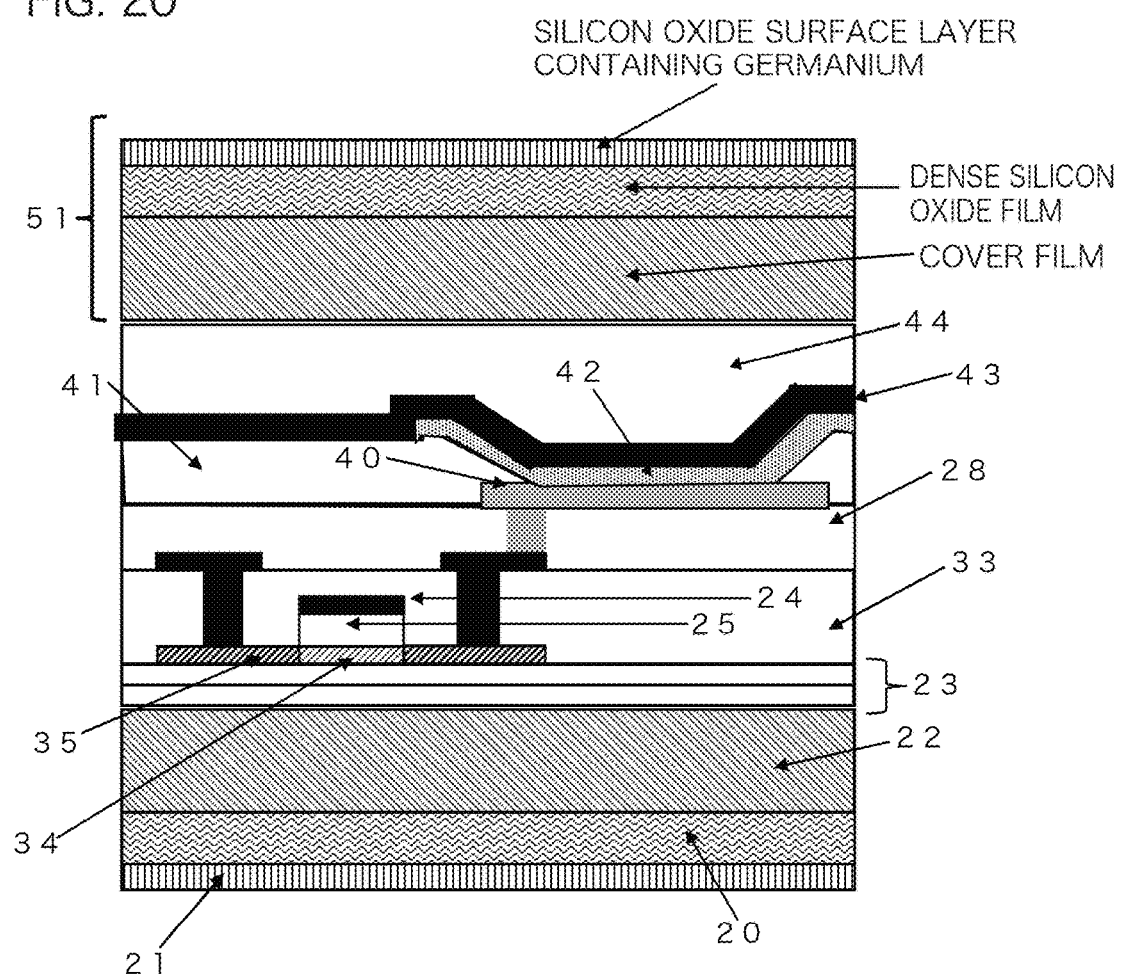
FIG. 20 is a diagram schematically illustrating a configuration in which a cover film having a dense inorganic barrier film is formed on a top view of a thin-film transistor flexible organic EL display as a flexible thin-film device according to a tenth embodiment of the invention.

FIG. 20 is a cross-sectional view illustrating a flexible thin-film device according to a tenth embodiment of the disclosure and is a diagram schematically illustrating a configuration in which a cover film including a dense inorganic barrier film is disposed particularly on the top surface of a thin-film transistor flexible organic EL display. On the basis of the processes described with reference to FIGS. 6A to 6G, a germanium oxide film 19 as a separation layer 11 is formed on a glass substrate 18 as a heat-resistant substrate 10 and a silicon oxide film as an inorganic barrier film is formed thereon. Since the glass substrate 18 has high heat resistance, the silicon oxide film is formed, for example, using a process of about 350° C. to 450° C. or the silicon oxide film is densified into a dense silicon oxide film 20 having high barrier capability using a technique of performing an annealing process at a temperature of about 350° C. to 450° C. after the silicon oxide film is formed. A cover film such as the polyimide film 22 is formed on the dense silicon oxide film 20 by an application or coating process. Thereafter, as in the above-mentioned examples, by immersing the resultant structure in hot water to dissolve the germanium oxide film 19 and separating the glass substrate 18, a film having a stacked structure including the cover film, the dense silicon oxide film 20, and the silicon oxide surface layer 21 containing germanium is formed. As illustrated in FIG. 20, the film having the stacked structure as a cover layer 51 is bonded to a sealing layer 44 of the thin-film transistor flexible organic EL display illustrated in FIG. 17. That is, in FIG. 20, a resin film including the dense inorganic barrier film is present on the upper side and the lower side of the thin-film element 15 including the thin-film transistor and the organic EL element, thereby reliability is further improved.

The cover film including the dense inorganic barrier film is not limited to the organic EL display, but can be used as a cover film of thin-film devices such as various displays, sensors, and batteries.

In any of the above-mentioned embodiments and examples, a method of forming a polyimide film 22 by applying and baking a source solution, a method of laminating a film-like polyimide film 22 formed in advance onto a dense inorganic barrier film, or the like can be used as the method of forming the polyimide film 22. Specifically, a desired polyimide film 22 can be formed by applying or printing polyimide varnish onto a dense inorganic barrier film and then performing an annealing process thereon at about 150° C. to 300° C. In the case of printing, a desired-shaped polyimide film 22 can be formed by printing varnish in only necessary regions on the substrate. In the case of application and printing, as illustrated in FIG. 3, the interface between the polyimide film and the dense inorganic barrier film has a structure having a short concave-convex cycle (a cycle of about several nm) which reflects the surface state of the heat-resistant substrate 10 or the separation layer 11. On the other hand, the interface between the silicon oxide barrier film and the polyimide film has a structure having a long concave-convex cycle (a cycle of about several hundreds nm to several tens μm) due to thickness irregularity of the polyimide film 22 at the time of application or printing. On the other hand, a polyimide film formed in advance may be laminated onto only necessary regions on the substrate. For example, the polyimide film 22 is formed in regions other than the edges of the substrate such that the polyimide film 22 is not present in the edges of the substrate and then the silicon oxide barrier film is formed on the entire surface of the substrate, thereby the polyimide film 22 including the end faces of the substrate can be completely sealed with the silicon oxide barrier film. As a result, it is possible to prevent impurities resulting from the polyimide film 22 from being infiltrated into the thin-film element at the time of formation of the thin-film element 15. In this case, as illustrated in FIG. 4, a structure in which the adhesive layer 16 is present between the polyimide film and the dense silicon oxide film 20 is formed.

In any of the above-mentioned embodiments and examples, the germanium oxide film 19 and the molybdenum oxide film can be used as a soluble layer at the time of separation, and the same manufacturing method can be applied.

In any of the above-mentioned embodiments and examples, the surface layer containing germanium or molybdenum can be removed. The surface layer can be removed by plasma etching using fluorine-based gas or chlorine-based gas or wet etching using an acid solution.

In any of the above-mentioned embodiments and examples, the dense inorganic barrier film can employ any one of a silicon oxide film, a silicon nitride film, a silicon oxy-nitride film, an aluminum oxide film, a tantalum oxide film, or plural arbitrary stacked structures. An arbitrary semiconductor film such as an oxide semiconductor film, a hydrogenated amorphous silicon film, a polycrystalline silicon film, a microcrystalline silicon film, or an organic semiconductor film can be used as a semiconductor active layer of a TFT. A certain base element can also be disposed on the opposite surface of the surface of the dense inorganic barrier film on which the resin layer is present or the opposite surface of the surface of the surface layer containing germanium or molybdenum on which the dense inorganic barrier film is present. The base element is an element for reinforcing strength of the resin layer such as the polyimide film. In this case, an adhesive or the like is present between the opposite surfaces and the base elements. When inorganic barrier films having the same element are used as at least one layer of the first inorganic layer and the second inorganic layer which are present on both surfaces of the resin layer, respectively, the inorganic barrier film used for the second inorganic layer is more densified and has a higher density than the inorganic barrier film used for the first inorganic layer. According to the disclosure, it is possible to provide a flexible thin-film device having a dense inorganic insulating film with a high density on a rear surface of the resin substrate. Since the dense inorganic insulating film with a high density has high barrier capability against infiltration of impurity such as water from the outside, it is possible to markedly improve reliability and a yield of a flexible thin-film device.

An object of the present disclosure is to provide a structure of a thin-film device in which a glass substrate can be separated from a resin substrate with a high yield using a chemical reaction without using a particular mechanical or physical force as in the related art, and an inorganic insulating film having high barrier capability can be formed on the rear surface side of the resin substrate, and a manufacturing method thereof.

In order to achieve the above-mentioned object, according to the disclosure, an inorganic insulating layer having high barrier capability is formed on a substrate having high heat resistance by a high-temperature process in advance, and a resin layer and a thin-film device are formed on the inorganic insulating layer. After the thin-film device is completely formed, the substrate having high heat resistance is separated from an interface between the substrate having high heat resistance and the inorganic insulating layer having high barrier capability using a certain technique. Accordingly, a flexible thin-film device in which the inorganic insulating layer having high barrier capability is formed on the rear surface side of the resin layer can be obtained. It is important that the inorganic insulating film having high barrier capability on the rear surface side is formed at a temperature higher than a heat-resistant temperature (glass transition temperature) of the resin layer. In the related art in which an inorganic insulating film is necessarily formed directly on the resin layer, the inorganic insulating film is formed at a temperature lower than the heat-resistance temperature of the resin layer, which is different from the disclosure.

In the disclosure, as the technique of "separating the substrate having high heat resistance from the interface between the substrate having high heat resistance and the inorganic insulating layer having high barrier capability," a germanium oxide film is formed between the substrate having high heat resistance, for example, a glass substrate, and the inorganic insulating layer having high barrier capability and water solubility of the germanium oxide film is utilized. Accordingly, in a thin-film device in which thin-film devices are formed on one surface of the resin layer and the inorganic insulating layer is formed on the other surface, a structure in which a surface layer containing germanium is formed on the surface of the inorganic insulating layer which is not in contact with the resin layer is realized. This structure is formed by forming a germanium oxide film and an inorganic insulating film on a hard substrate such as a glass substrate at a process temperature of 350° C. or higher, forming a resin layer and thin-film devices thereon, and separating the glass substrate using high-speed dissolution (that is, chemical reaction) of the germanium oxide film in hot water. Since the glass substrate is separated by dissolving the oxide germanium, it is possible to perform high-yield separation without using a particular mechanical or physical force as in the related art. At this time, since the inorganic insulating film as a barrier film which is present on the rear surface of the resin layer undergoes a high-temperature process of 350° C. or higher, the inorganic insulating film is a very dense film and it is thus possible to solve the problem of having low barrier capability in the related art. Mutual diffusion of atoms is caused in the interface between the germanium oxide film and the inorganic insulating film by the high-temperature process and thus the surface layer containing germanium is formed on the surface of the inorganic insulating layer. Molybdenum oxide may be used as the water-soluble metal oxide.

A silicon oxide film, a silicon nitride film, a silicon oxy-nitride film, an aluminum oxide film, a tantalum oxide film, or the like can be suitably used as the inorganic insulating film, and a stacked structure thereof may be used. A polyimide film, a polyether sulfone (PES) film, a polyethylene terephthalate (PET) film, or the like can be used as the resin layer.

Active elements such as thin-film transistors or thin-film diodes and passive elements such as resistors, capacitors, or inductors can be used as the thin-film devices, and display elements in which display portions are added to the elements or the like can be used.

According to the embodiments, it is possible to provide a flexible thin-film device having a dense inorganic insulating film with a high density on a rear surface of the resin substrate. Since the dense inorganic insulating film with a high density has high barrier capability against infiltration of impurity such as water from the outside, it is possible to markedly improve reliability and a yield of a flexible thin-film device.

The resin substrate serving as a substrate of a flexible thin-film device is likely to absorb moisture, and absorbs moisture in the process of manufacturing a device, thereby causing swelling and formation of a fold. According to the embodiments, since the dense inorganic insulating film with a high density is formed on the rear surface of the resin substrate, it is possible to effectively prevent the swelling and the formation of a fold and to enhance a production yield. Particularly, even when using thin-film transistors showing a significant instability in infiltration of moisture as switching elements, it is possible to manufacture a thin film transistor device or a flexible display such as an organic EL display or a liquid crystal display with a high yield, and to improve long-term reliability thereof.

Regarding industrial applicability of the disclosure, the disclosure can be applied to a flexible liquid crystal display, a flexible organic EL display, and a flexible flat-panel display device such as an electronic paper. Particularly, it is possible to effectively prevent infiltration of impurities such as water or sodium from the outside and thus to manufacture a flexible display with high reliability.

Alternatively, the disclosure is not limited to the displays, but the disclosure can be used for a thin-film cell device, a thin-film sensor device, or a thin-film thermoelectric conversion device of which functions are realized using the flexible thin-film devices.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A thin-film device, comprising:
   a resin film which includes a first surface and a second surface facing the first surface;
   a first inorganic layer on the first surface; a thin-film element on the first inorganic layer; and
   a second inorganic layer on the second surface,
   wherein a film density of the second inorganic layer is greater than a film density of the first inorganic layer, and
   wherein an interface between the first inorganic layer and the resin film has a concave-convex structure with a longer concave-convex cycle as compared with a concave-convex structure of an interface between the second inorganic layer and the resin film.

2. The thin-film device according to claim 1, wherein the second inorganic layer and the resin film are bonded by an adhesive layer.

3. The thin-film device according to claim 1, wherein the second inorganic layer is any one of a silicon oxide film, a silicon nitride film, a silicon oxy-nitride film, an aluminum oxide film, and a tantalum oxide film.

4. The thin-film device according to claim 1, wherein the second inorganic layer has a stacked structure including at least two films of a silicon oxide film, a silicon nitride film, a silicon oxy-nitride film, an aluminum oxide film, and a tantalum oxide film.

5. The thin-film device according to claim 3, wherein the silicon oxide film constituting the second inorganic layer has a film density equal to or greater than 2.25 $g/cm^3$.

6. The thin-film device according to claim 3, wherein the silicon nitride film constituting the second inorganic layer has a film density equal to or greater than 2.70 $g/cm^3$.

7. The thin-film device according to claim 1, wherein a surface layer including germanium is formed on a surface of the second inorganic layer not facing the resin film.

8. The thin-film device according to claim 7, wherein germanium in the surface layer including germanium is present in a state in which germanium is chemically bonded to oxygen or nitrogen.

9. The thin-film device according to claim 7, wherein a concentration of germanium in the surface layer including germanium is equal to or greater than $1\times10^{18}$ $cm^{-3}$.

10. The thin-film device according to claim 1, wherein a surface layer including molybdenum is formed on a surface of the second inorganic layer not facing the resin film.

11. The thin-film device according to claim 10, wherein molybdenum in the surface layer including molybdenum is present in a state in which molybdenum is chemically bonded to oxygen or nitrogen.

12. The thin-film device according to claim 10, wherein a concentration of molybdenum in the surface layer including molybdenum is equal to or greater than $1\times10^{18}$ $cm^{-3}$.

13. The thin-film device according to claim 1, wherein the thin-film element is a display element including combination units of an active element and a pixel display unit which are arranged in a matrix shape.

14. The thin-film device according to claim 13, wherein the pixel display unit is a display element including organic electroluminescence (EL).

15. The thin-film device according to claim 13, wherein the pixel display unit is a display element including liquid crystal.

16. The thin-film device according to claim 13, wherein the active element is a thin-film transistor.

17. The thin-film device according to claim 16, wherein a channel active layer of the thin-film transistor is any one of an oxide semiconductor film, an amorphous silicon film, a polycrystalline silicon film, a microcrystalline silicon film, and an organic semiconductor film.

18. The thin-film device according to claim 1, wherein the thin-film element is a thin-film solar cell using PIN junction of silicon or a thin-film solar cell including a chalcopyrite-based compound of Cu—In—S (or Se).

19. A thin-film device, comprising:
   a resin film which includes a first surface and a second surface facing the first surface;
   a first inorganic layer on the first surface;
   a thin-film element on the first inorganic layer; and
   a second inorganic layer on the second surface,
   wherein a film density of the second inorganic layer is greater than a film density of the first inorganic layer,
   wherein a surface layer including germanium is formed on a surface of the second inorganic layer not facing the resin film, and
   wherein a concentration of germanium in said surface layer including germanium is within a range from $1\times10^{18}$ $cm^{-3}$ to $3\times10^{21}$ $cm^{-3}$.

20. A thin-film device, comprising:
   a resin film which includes a first surface and a second surface facing the first surface;

a first inorganic layer on the first surface;
a thin-film element on the first inorganic layer; and
a second inorganic layer on the second surface,
wherein a film density of the second inorganic layer is greater than a film density of the first inorganic layer,
wherein a surface layer including molybdenum is formed on a surface of the second inorganic layer not facing the resin film, and
wherein a concentration of molybdenum in said surface layer including molybdenum is within a range from $1\times10^{18}$ cm$^{-3}$ to $3\times10^{21}$ cm$^{-3}$.

* * * * *